US012772855B2

(12) United States Patent
Wu et al.

(10) Patent No.: US 12,772,855 B2
(45) Date of Patent: Oct. 20, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Zheng Wei Wu, Kaohsiung (TW); Cheng Kai Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 880 days.

(21) Appl. No.: 18/082,473

(22) Filed: Dec. 15, 2022

(65) Prior Publication Data

US 2024/0203896 A1 Jun. 20, 2024

(51) Int. Cl.

| | |
|---|---|
| ***H10W 42/20*** | (2026.01) |
| ***H10W 70/60*** | (2026.01) |
| ***H10W 70/63*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ......... *H10W 42/20* (2026.01); *H10W 74/014* (2026.01); *H10W 74/114* (2026.01); *H10W 74/131* (2026.01); *H10W 70/611* (2026.01); *H10W 70/635* (2026.01); *H10W 90/701* (2026.01)

(58) Field of Classification Search

CPC ... H10W 90/10; H10W 90/15; H10W 90/155; H10W 90/00; H10W 42/20; H10W 42/40; H10W 42/405; H10W 42/25; H10W 42/261; H10W 42/267; H10W 42/271; H10W 42/273; H10W 74/114; H10W 70/635; H10W 70/611

See application file for complete search history.

(56) References Cited

U.S. PATENT DOCUMENTS

| | | | | |
|---|---|---|---|---|
| 9,818,722 | B1 * | 11/2017 | Wang | H01L 21/565 |
| 2018/0130758 | A1 | 5/2018 | Chiang et al. | |
| 2019/0103653 | A1 | 4/2019 | Jeong et al. | |

* cited by examiner

*Primary Examiner* — Jose R Diaz

(74) *Attorney, Agent, or Firm* — Foley & Lardner LLP

(57) ABSTRACT

The present disclosure provides a semiconductor device package including a carrier, an electronic component, and a shielding layer. The carrier includes a predetermined non-shielding region. The electronic component is disposed over the predetermined non-shielding region. The shielding layer includes a first portion disposed over the predetermined non-shielding region.

16 Claims, 19 Drawing Sheets

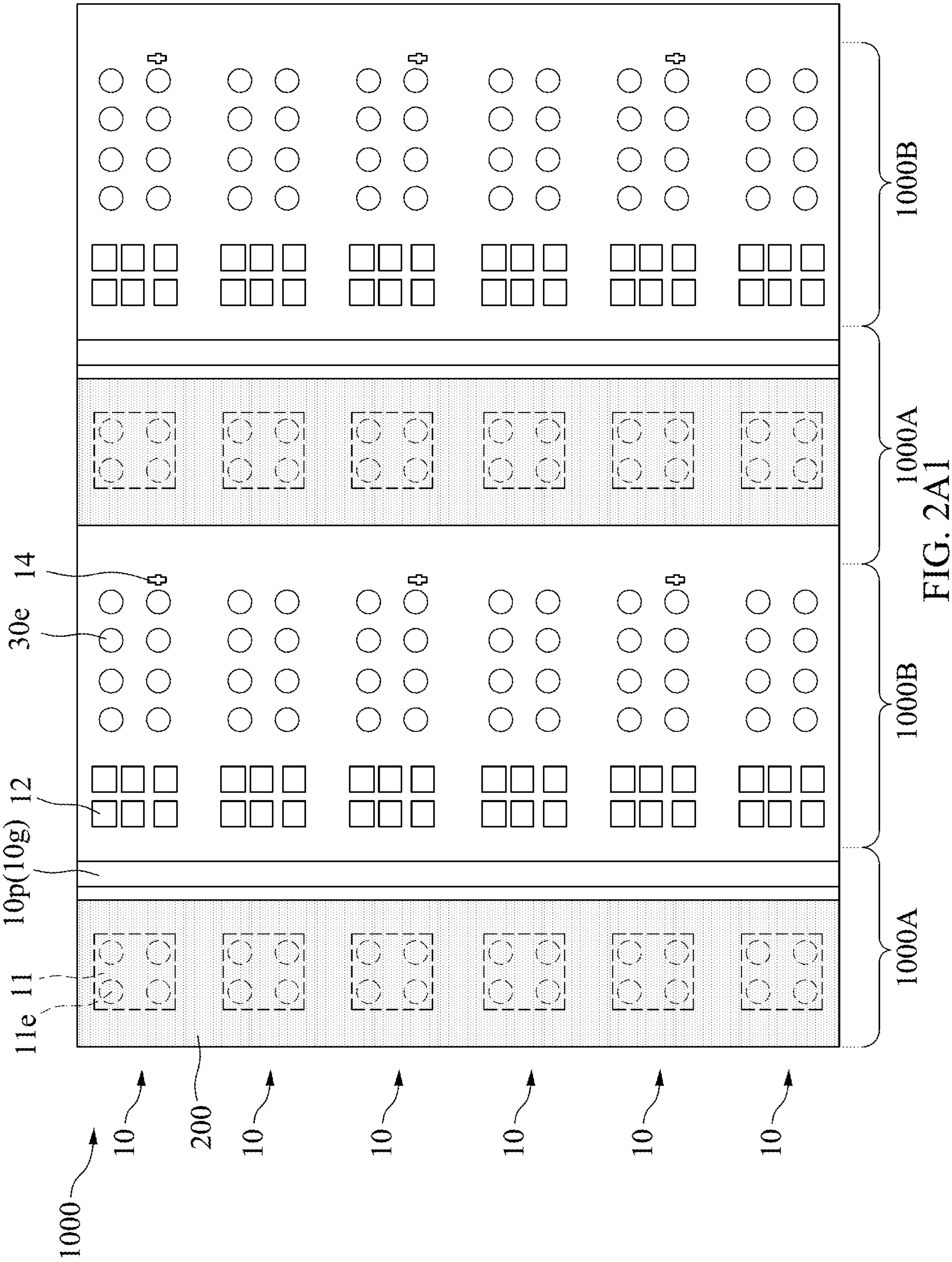
FIG. 2A1

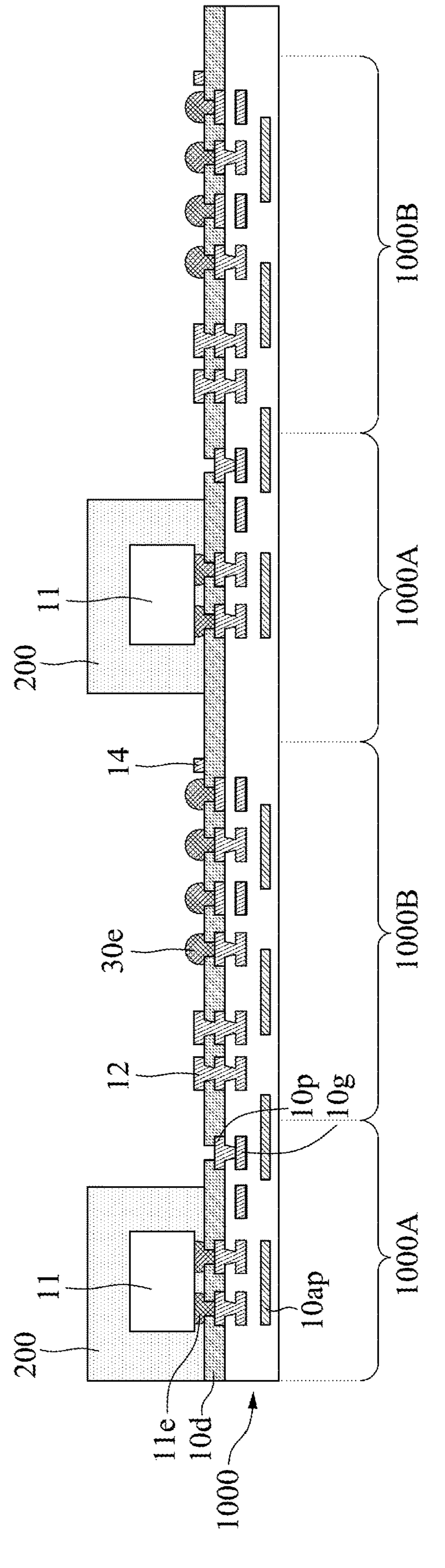
FIG. 2A2

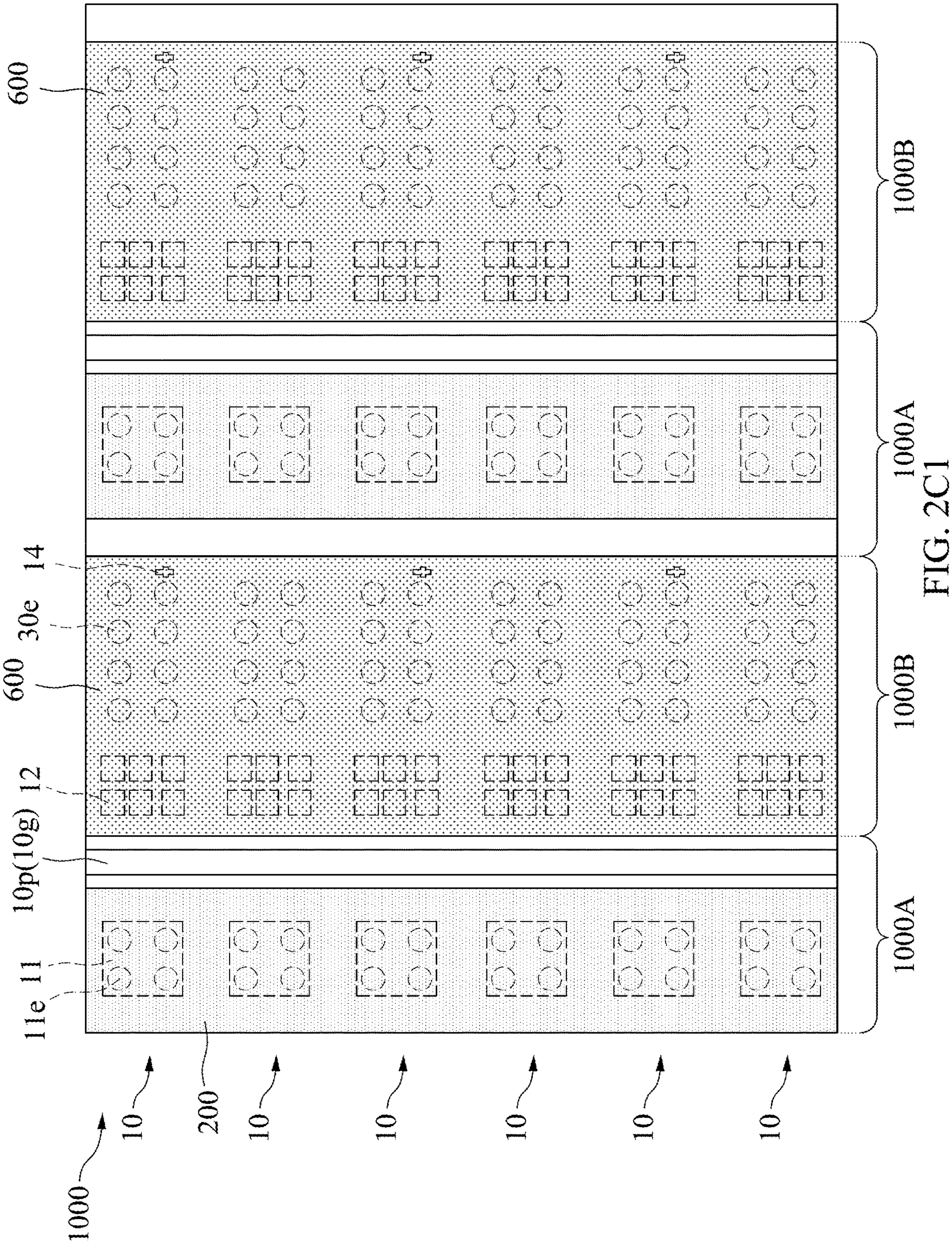
FIG. 2C1

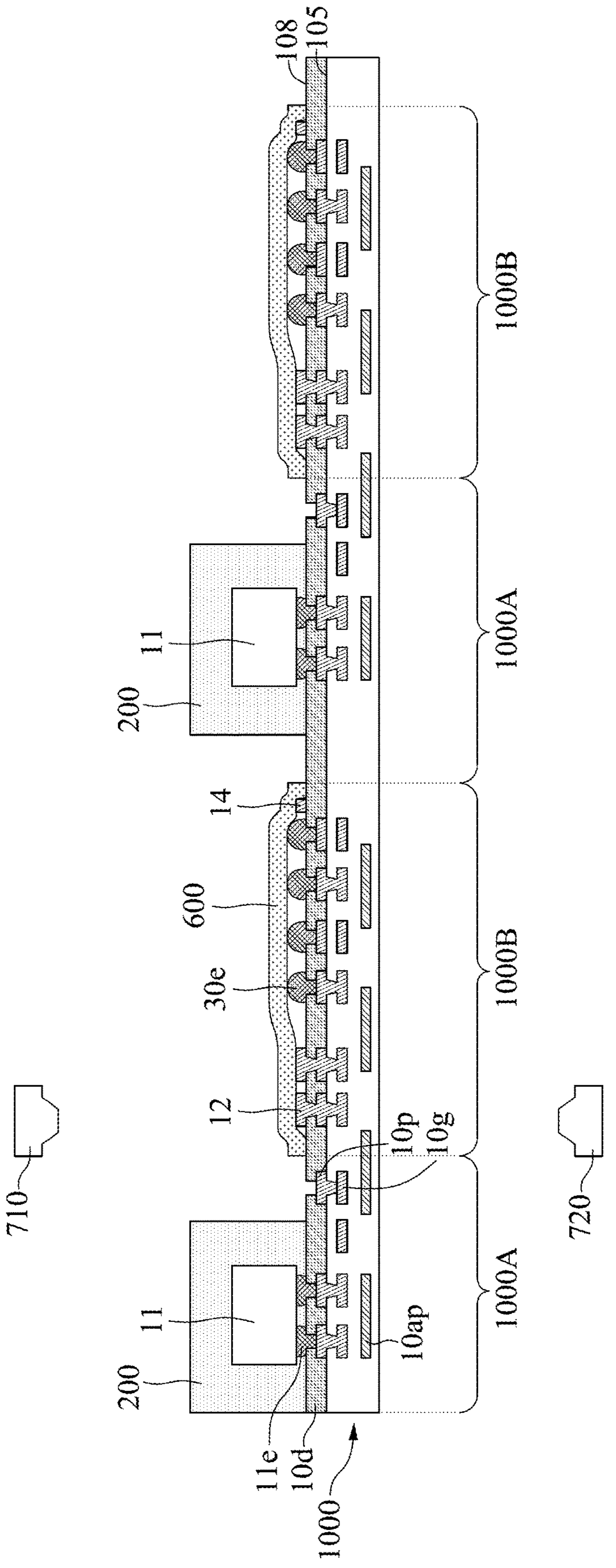
FIG. 2C2

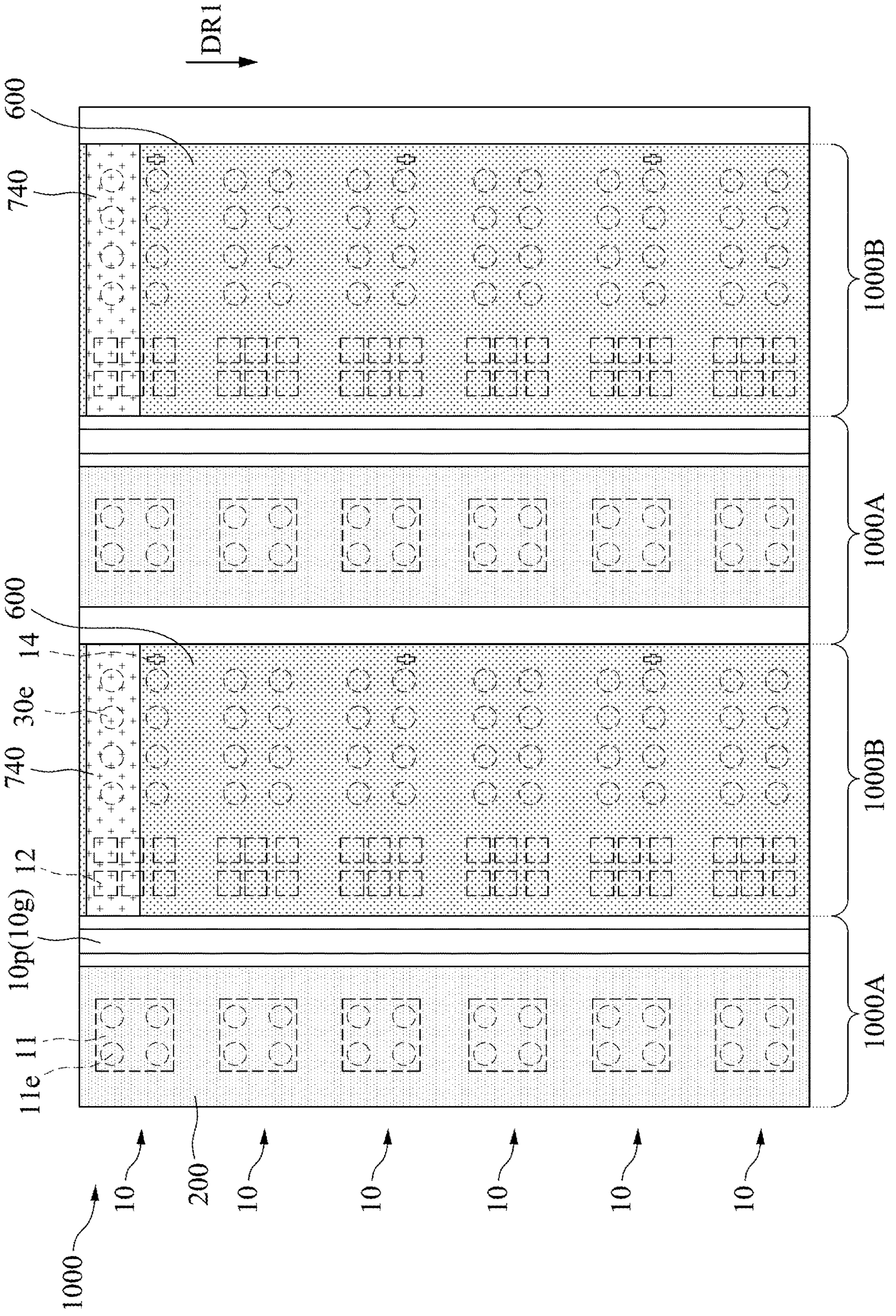
FIG. 2D1

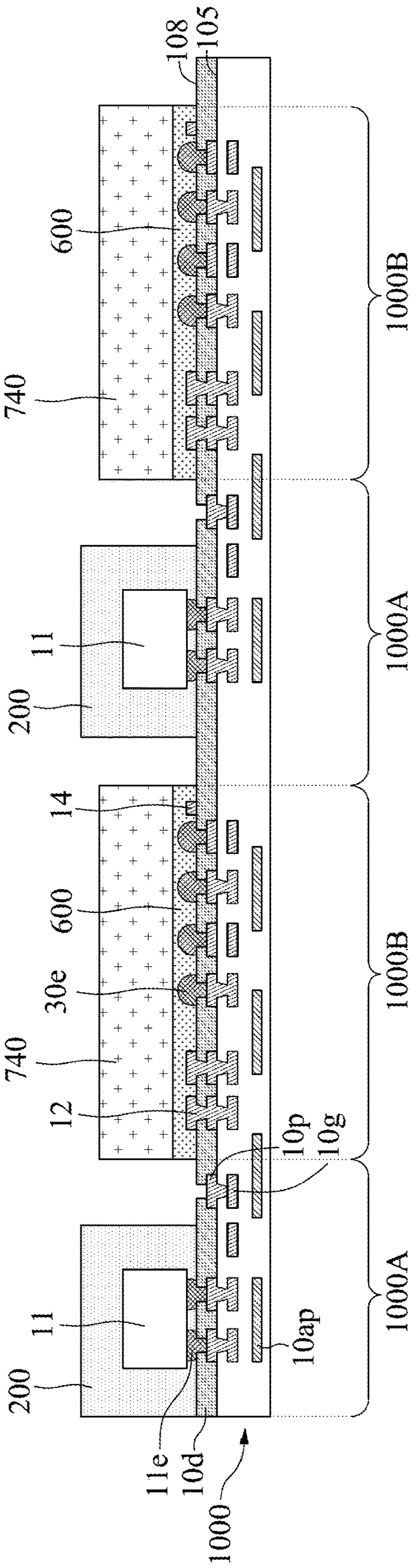
FIG. 2D2

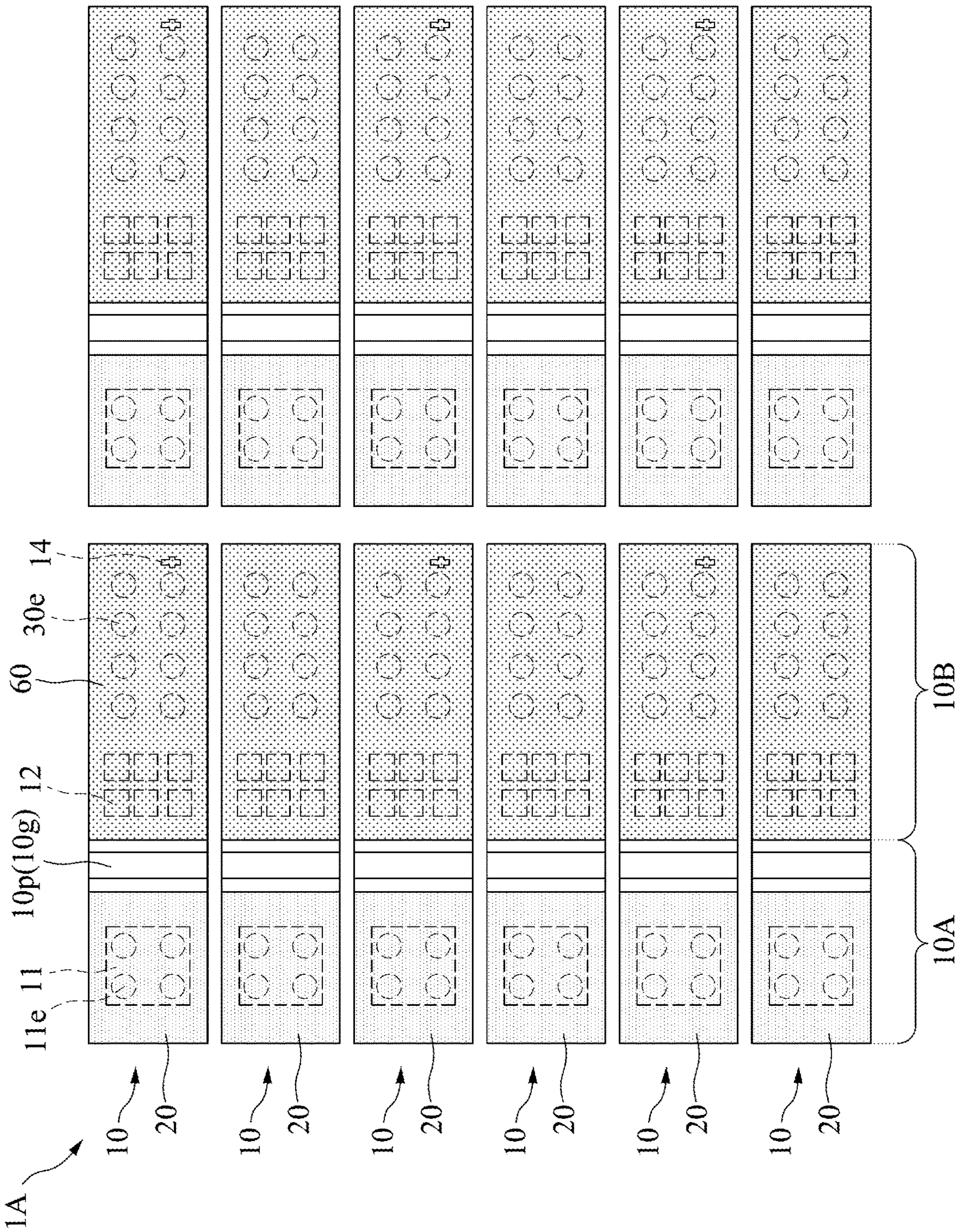
FIG. 2E1

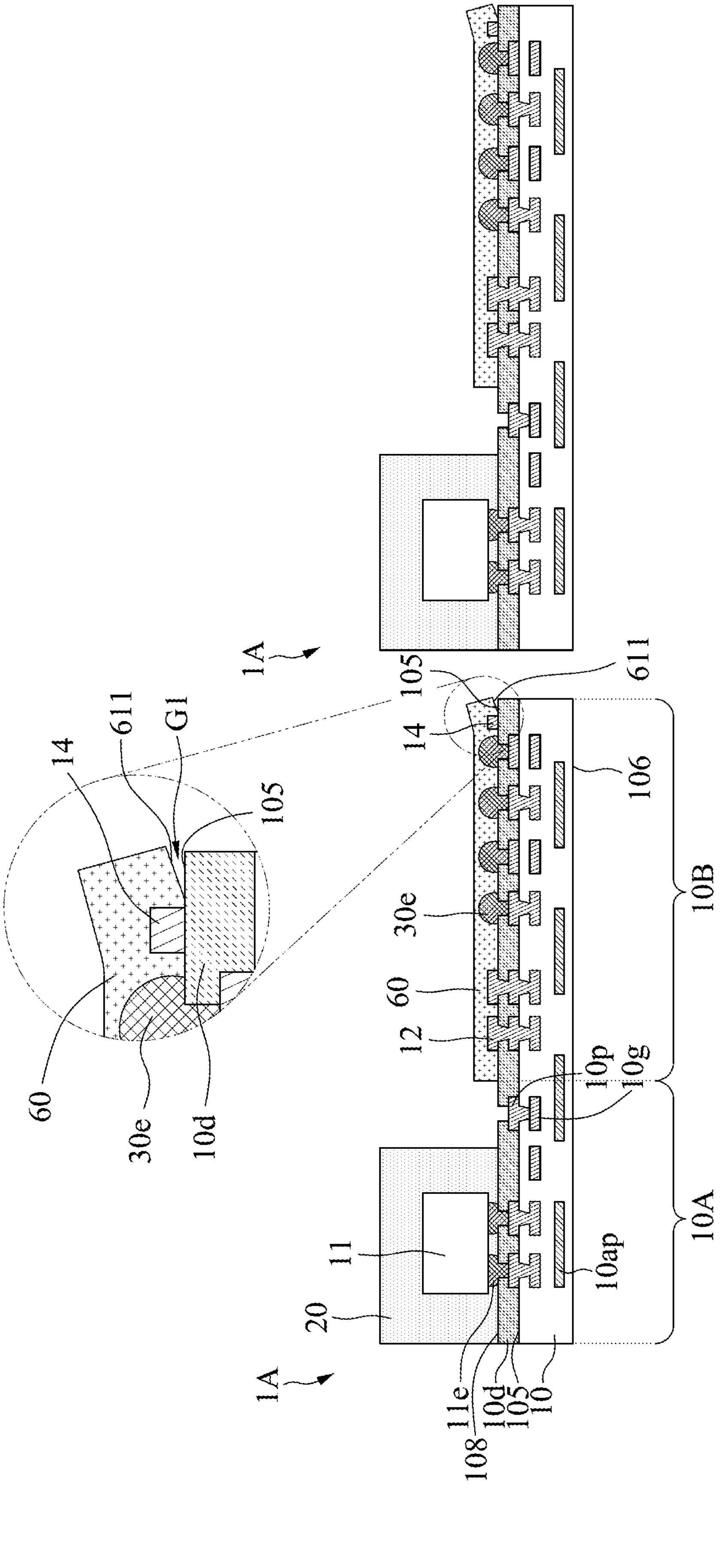
FIG. 2E2

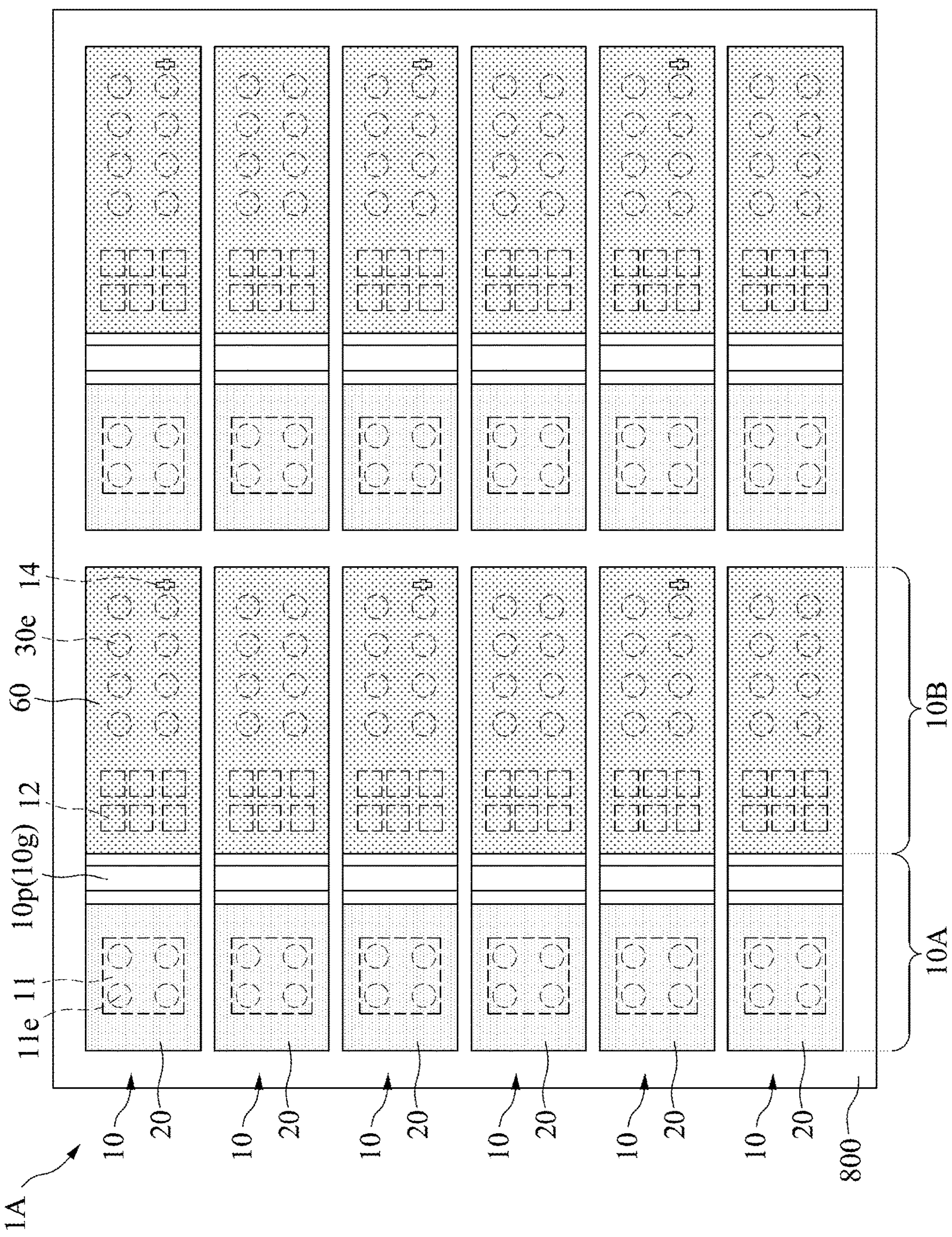
FIG. 2F1

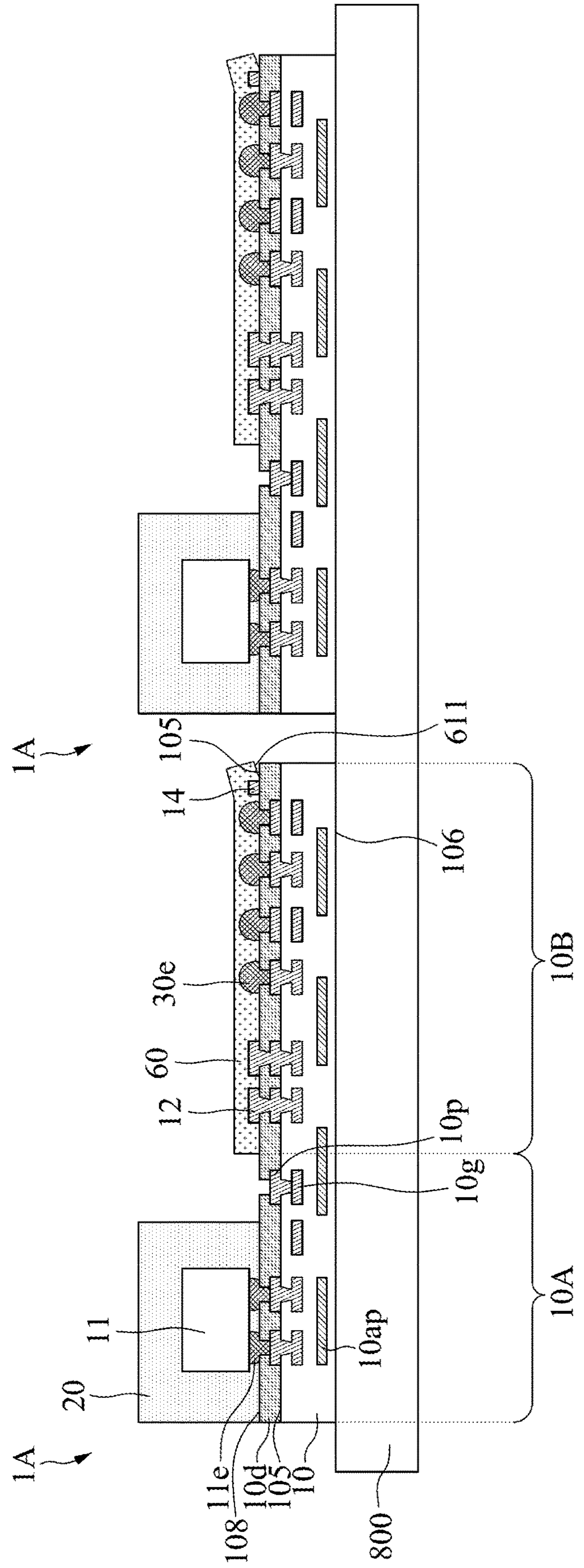
FIG. 2F2

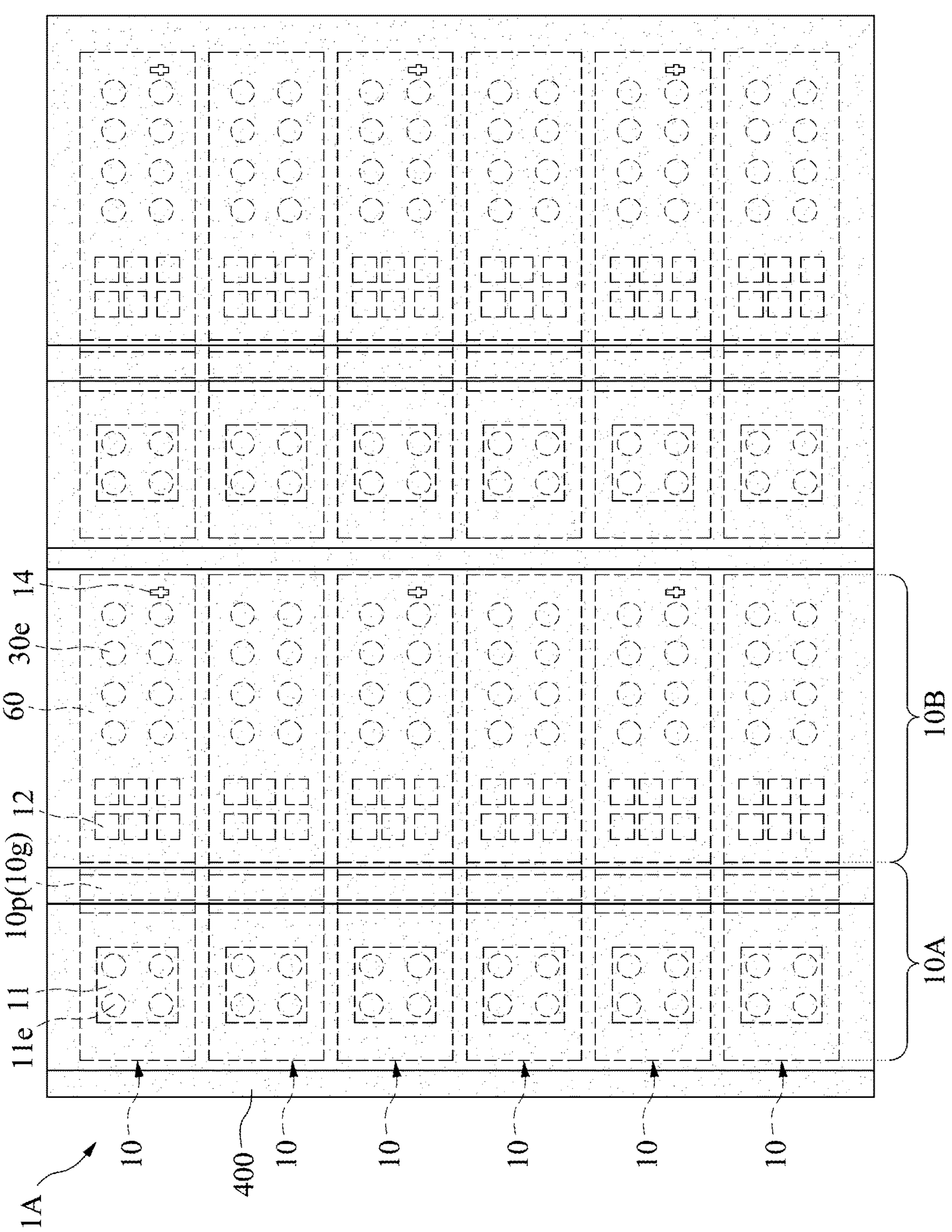
FIG. 2G1

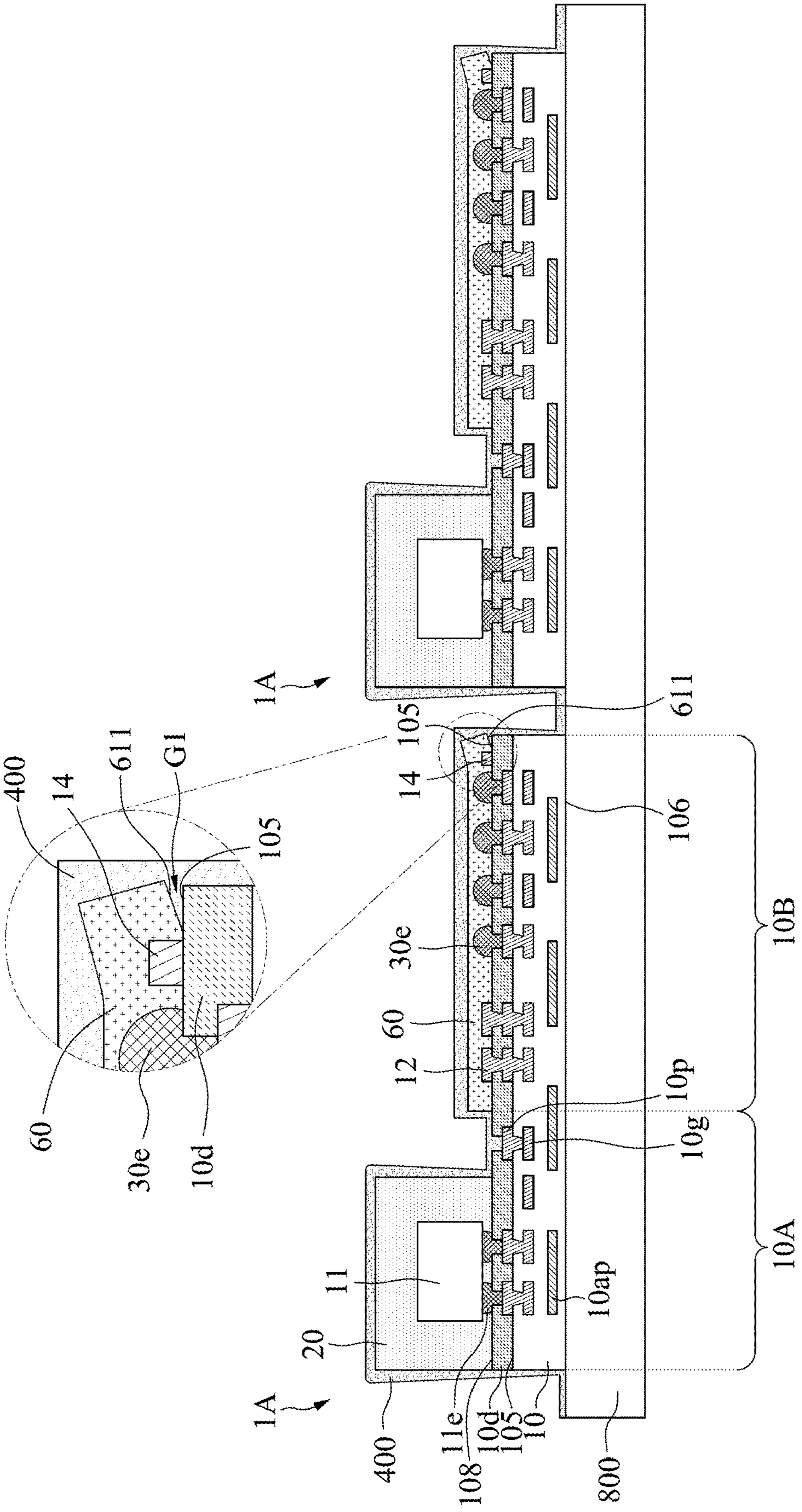
FIG. 2G2

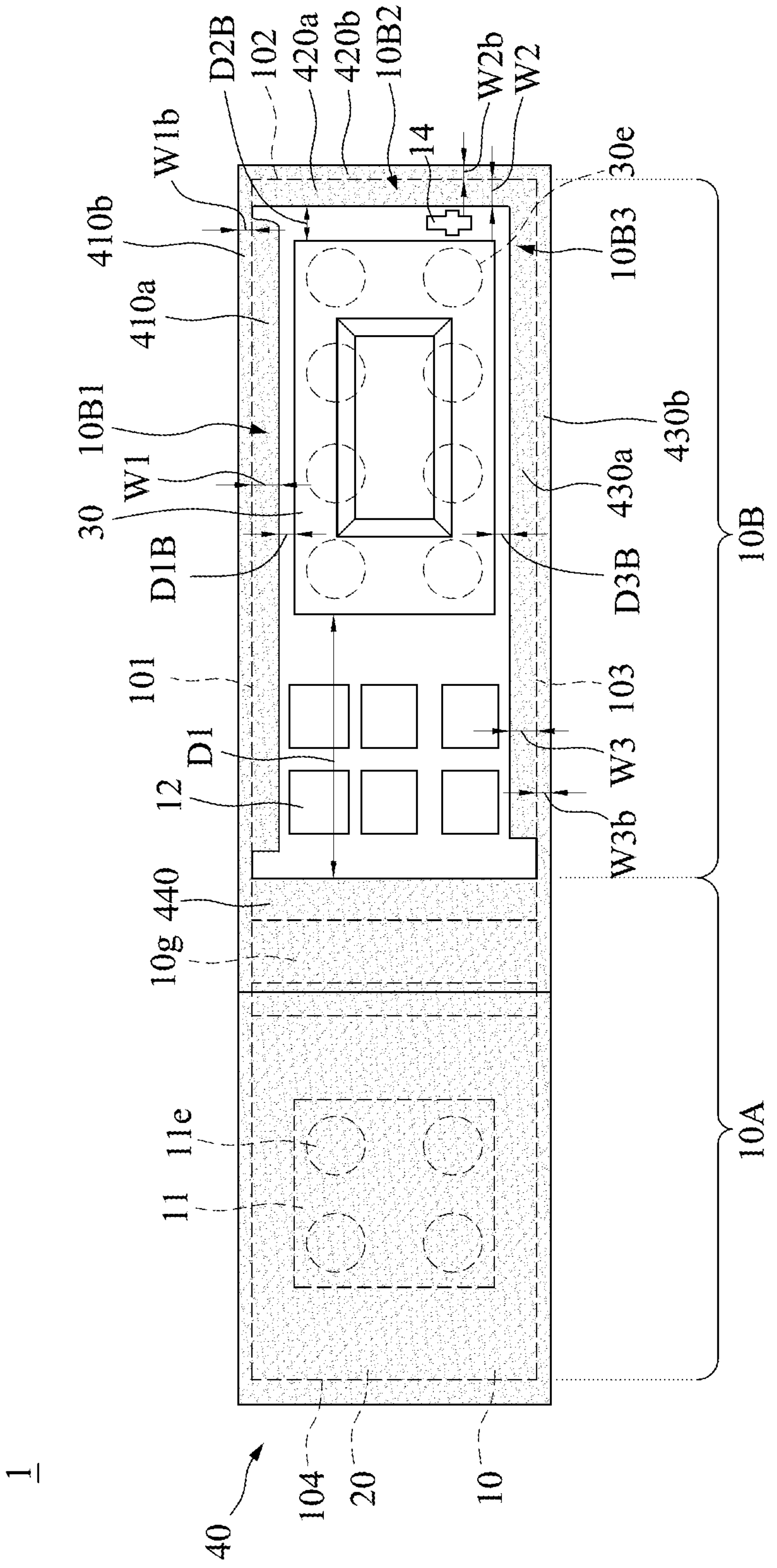
FIG. 2H1

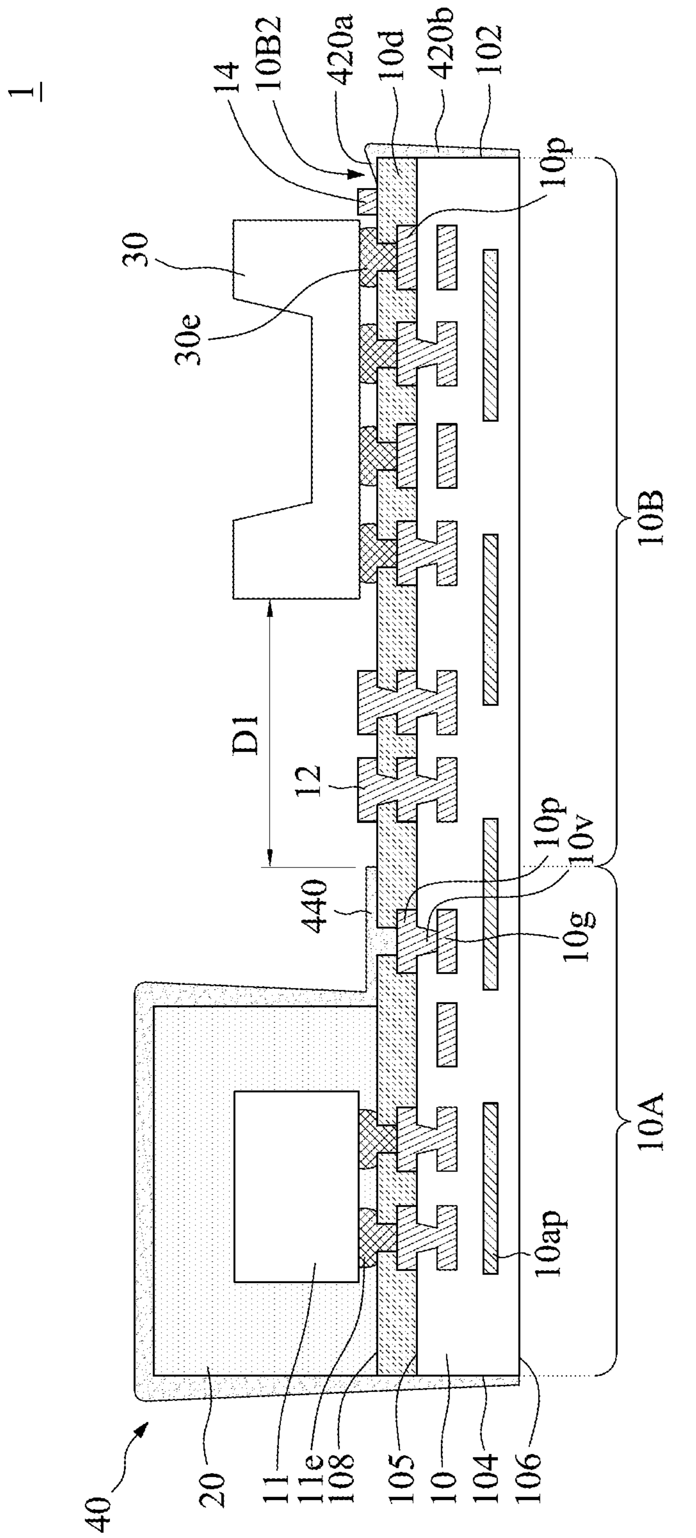
FIG. 2H2

SEMICONDUCTOR DEVICE PACKAGE AND METHOD OF MANUFACTURING THE SAME

BACKGROUND

1. Technical Field

The present disclosure generally relates to a semiconductor device package and a method of manufacturing a semiconductor device package.

2. Description of the Related Art

In existing techniques for forming an electromagnetic interference (EMI) shielding layer on an antenna package (such as Antenna in Package (AiP)), a mask may be utilized to protect the conductive pads. The mask may cover the conductive pads and prevent them from overlapping or being covered by the EMI shielding layer. As technology progresses, such use of masks is unfavorable for miniaturization of the antenna package since the dimensions of the mask are incompatible with the keep out zone (KOZ) around the conductive pads.

SUMMARY

In some arrangements, a semiconductor device package includes a carrier, an electronic component, and a shielding layer. The carrier includes a predetermined non-shielding region. The electronic component is disposed over the predetermined non-shielding region. The shielding layer includes a first portion disposed over the predetermined non-shielding region.

In some arrangements, a method of manufacturing a semiconductor device package includes providing a carrier strip including a plurality of substrate units, each of the substrate units including a predetermined non-shielding region; and forming a mask layer to cover the predetermined non-shielding regions of at least two of the plurality of substrate units of the carrier strip.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 2A1, FIG. 2C1, FIG. 2D1, FIG. 2E1, FIG. 2F1, FIG. 2G1, and FIG. 2H1 are top views during one or more stages of a method of manufacturing a semiconductor device package in accordance with some arrangements of the present disclosure.

FIG. 2A2, FIG. 2B, FIG. 2C2, FIG. 2D2, FIG. 2E2, FIG. 2F2, FIG. 2G2, and FIG. 2H2 are cross-sections during one or more stages of a method of manufacturing a semiconductor device package in accordance with some arrangements of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
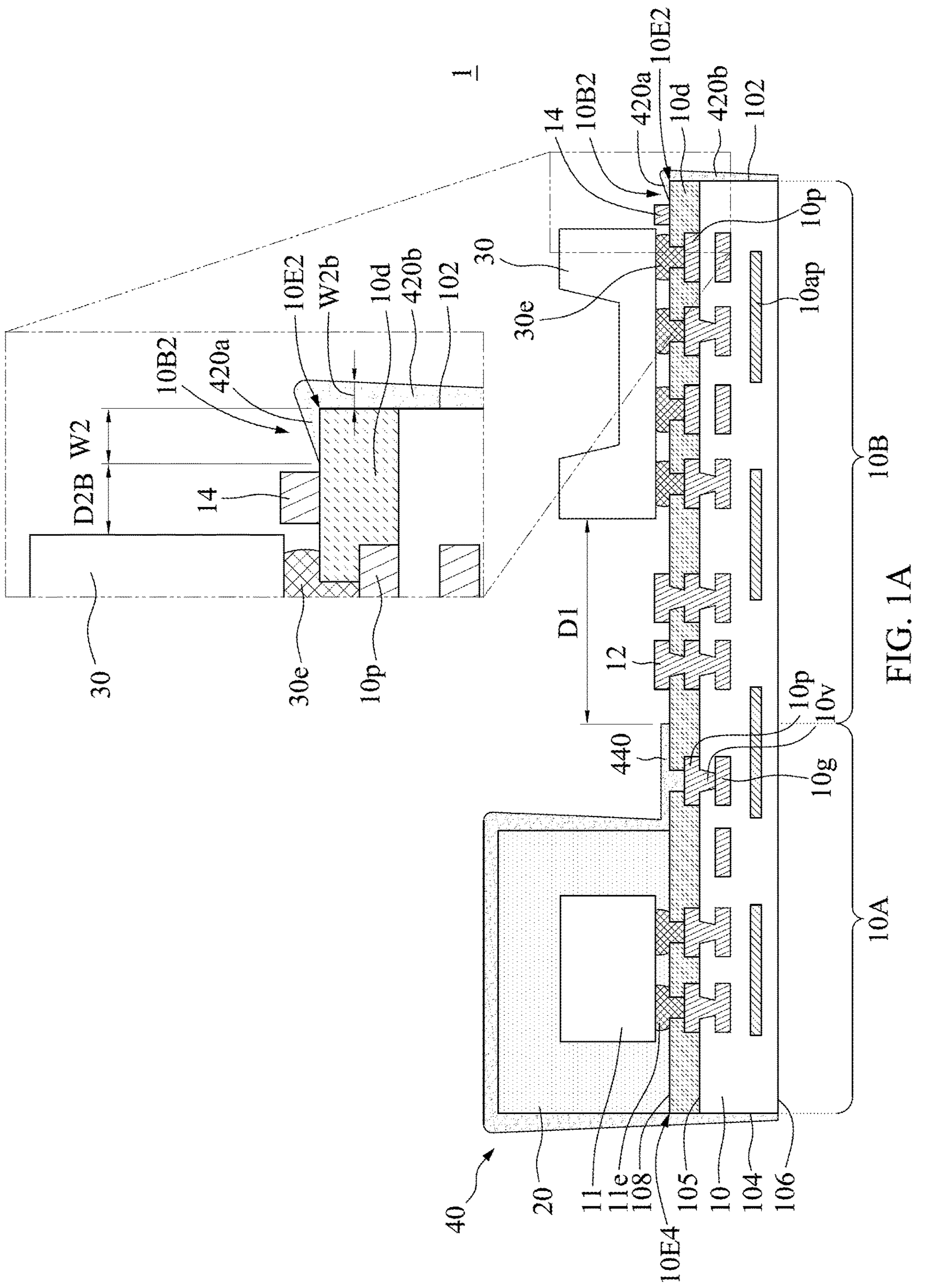
FIG. 1A is a cross-section of a semiconductor device package, in accordance with some arrangements of the present disclosure.

The following disclosure provides many different arrangements, or examples, for implementing different features of the provided subject matter. Specific examples of components and arrangements are described herein. These are, of course, merely examples and are not intended to be limiting. In the present disclosure, a reference to the formation of a first feature over or on a second feature in the description that follows may include arrangements in which the first and second features are formed in direct contact, and may also include arrangements in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various arrangements and/or configurations discussed.

Arrangements of the present disclosure are discussed in detail as follows. It should be appreciated, however, that the present disclosure provides many applicable concepts that can be embodied in a wide variety of specific contexts. The specific arrangements discussed are merely illustrative and are not intended to limit the scope of the disclosure.

Figure 1B:
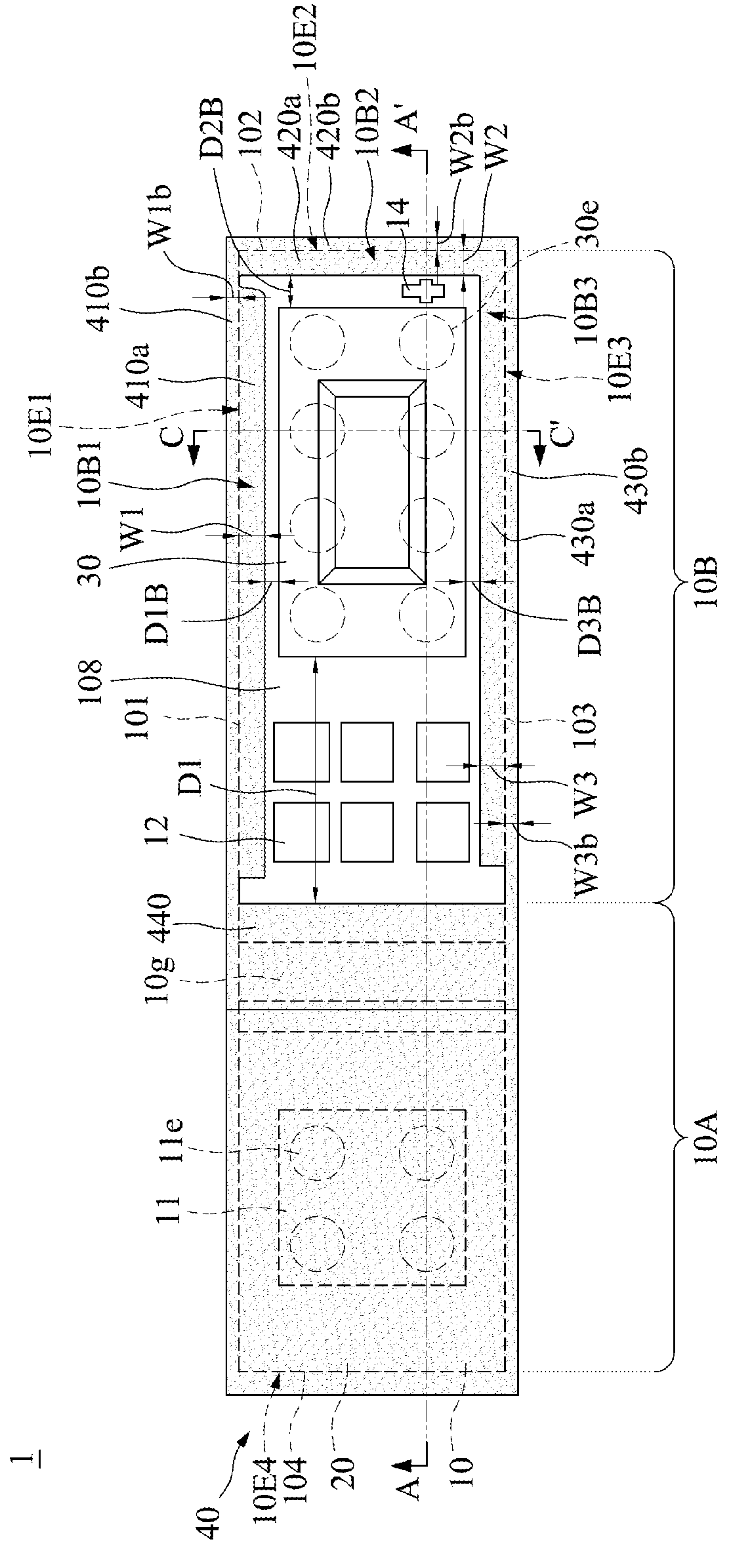
FIG. 1B is a top view of a semiconductor device package, in accordance with some arrangements of the present disclosure.

FIG. 1A is a cross-section of a semiconductor device package 1, in accordance with some arrangements of the present disclosure. FIG. 1B is a top view of the semiconductor device package 1. In some arrangements, the cross-section in FIG. 1A is a cross-section along line A-A' in the top view in FIG. 1B.

The semiconductor device package 1 may include a carrier 10, an encapsulant 20, electronic components 11 and 30, electrical contacts 11*e* and 30*e*, conductive terminals 12, an alignment mark 14, and a shielding layer 40.

The semiconductor device package 1 may be or include an electronic package, such as an antenna device or an antenna package. In some arrangements, the semiconductor device package 1 may be or include a wireless device, such as a user equipment (UE), a mobile station, a mobile device, an apparatus communicating with the Internet of Things (IoT), etc.

The carrier 10 may be or include a substrate. In some arrangements, the carrier 10 may be or include a printed circuit board, such as a paper-based copper foil laminate, a composite copper foil laminate, or a polymer-impregnated glass-fiber-based copper foil laminate. The carrier 10 may have sides 101, 102, 103, and 104 (also referred to as "surfaces," "lateral surfaces," or "lateral sides"). The sides 102 and 104 are opposite to each other. The sides 101 and 103 are indicated in FIG. 1B and are opposite to each other.

The carrier 10 may have a surface 105 (or an upper surface) and a surface 106 (or a bottom surface) opposite to the surface 105.

In some arrangements, the carrier 10 may include conductive layer(s), pad(s), trace(s), via(s), or other interconnection(s). For example, the carrier 10 may include a build-up circuit. For example, the carrier 10 may include one or more conductive layers and one or more dielectric layers. The conductive layers may include routing traces to route, signal, power, ground, clock, or the like. For example, the conductive layers may include one or more antenna elements, one or more transmission lines (e.g., communications cables), and one or more grounding lines and/or grounding planes.

For example, the carrier 10 may include one or more conductive pads 10*p* in proximity to, adjacent to, or embedded in and exposed by the surface 105 of the carrier 10. The carrier 10 may further include a dielectric layer 10*d* disposed over or on the surface 105, and the dielectric layer 10*d* may expose at least a portion of the conductive pads 10*p* for electrical connections. In some arrangements, the dielectric layer 10*d* may have a surface 108 (or an upper surface) which may be referred to as a top surface of the carrier 10. The carrier 10 may have edges 10E1, 10E2, 10E3, and 10E4. The edges 10E2 and 10E4 are opposite to each other. The edges 10E1 and 10E3 are indicated in FIG. 1B and are opposite to each other. The edges 10E1, 10E2, 10E3, and 10E4 are distinct from each other. In some arrangements, the carrier 10 may include a grounding line 10*g*. The grounding line 10*g* may be disposed in the dielectric layers of the carrier 10. The grounding line 10*g* may be surrounded or covered by the dielectric layers of the carrier 10. In some arrangements, the carrier 10 may include antenna elements 10*ap*. The antenna elements 10*ap* may form an antenna array. The antenna elements 10*ap* may be in proximity to, adjacent to, or embedded in and exposed by the surface 106 of the carrier 10.

At least one of the conductive pads 10*p* may be electrically connected to the grounding line 10*g* through a conductive via 10*v*. In some arrangements, the at least one of the conductive pads 10*p*, the conductive via 10*v*, and the grounding line 10*g* may be collectively referred to as a grounding structure.

In some arrangements, the conductive pads 10*p*, the conductive vias 10*v*, and the grounding line 10*g* may include a conductive material such as a metal or metal alloy. Examples of the conductive material include gold (Au), silver (Ag), copper (Cu), platinum (Pt), palladium (Pd), other metal(s) or alloy(s), or a combination of two or more thereof. In some arrangements, the dielectric layers of the carrier 10 may include pre-impregnated composite fibers (e.g., pre-preg), borophosphosilicate glass (BPSG), silicon oxide, silicon nitride, silicon oxynitride, undoped silicate glass (USG), any combination thereof, or the like. Examples of a pre-preg may include, but are not limited to, a multi-layer structure formed by stacking or laminating a number of pre-impregnated materials/sheets. In some arrangements, the dielectric layer 10*d* disposed over or on the surface 105 of the carrier 10 may include a solder mask or a solder resist.

The carrier 10 may include regions 10A and 10B. In some arrangements, the region 10A is or includes a shielding region, and the region 10B is or includes a predetermined non-shielding region. In some arrangements, the region 10B is adjacent to the sides 101, 102, and 103 of the carrier 10. In some arrangements, the regions 10A and 10B may be different or distinct regions on the surface 105 of the carrier 10. It is noted that the regions 10A and 10B may not have a visible or observable boundary. The region 10A may abut or be connected with the region 10B. In other arrangements, the region 10A may be laterally spaced apart from the region 10B by a gap or a distance. The regions 10A and 10B of the carrier 10 may include or encompass surface regions of the surface 105 or imaginary sections of the carrier 10.

The electronic component 11 may be disposed over or on the surface 105 of the carrier 10. The electronic component 11 may be disposed over or on the region 10A of the carrier 10. The electronic component 11 may be electrically connected to one or more other electrical components (if any) and to the carrier 10 (e.g., to the interconnection(s)), and the electrical connection may be attained by way of flip-chip, wire-bond techniques, metal to metal bonding (such as Cu to Cu bonding), or hybrid bonding. For example, electronic component 11 may be electrically connected to the carrier 10 through one or more electrical contacts 11*e* (also referred to as "conductive terminals"). In some arrangements, the electrical contacts 11*e* may include controlled collapse chip connection (C4) bumps, a ball grid array (BGA), or a land grid array (LGA).

In some arrangements, the electronic component 11 may be a chip or a die including a semiconductor substrate, one or more integrated circuit devices, and one or more overlying interconnection structures therein. The integrated circuit devices may include active devices such as transistors and/or passive devices such as resistors, capacitors, inductors, or a combination thereof. In some arrangements, the electronic component 11 may be integrated circuit (IC) dies, radio frequency ICs (RFICs), power management ICs (PMICs), surface mount devices (SMDs), etc.

The conductive terminals 12 may be disposed over or on the surface 105 of the carrier 10. The conductive terminals 12 may be disposed over or on the region 10B of the carrier 10. The conductive terminals 12 may be electrically connected to one or more other electrical components (if any) and to the carrier 10 (e.g., to the interconnection(s)). For example, the conductive terminals 12 may be electrically connected to the conductive pads 10*p* of the carrier 10. In some arrangements, the conductive terminals 12 may be test pads for testing functions of electrical components or elements within or connected to the carrier 10. The conductive terminals 12 may be exposed by the encapsulant 20 and the shielding layer 40. For example, from a top view perspective, the conductive terminals 12 may be free from overlapping and between the shielding layer 40 and the electronic component 30. In some arrangements, the conductive terminals 12 may include a conductive material such as a metal or metal alloy. Examples of the conductive material include Au, Ag, Cu, Pt, Pd, other metal(s) or alloy(s), or a combination of two or more thereof.

The alignment mark 14 may be disposed over or on the surface 105 of the carrier 10. The alignment mark 14 may be disposed over or on the region 10B of the carrier 10. The alignment mark 14 may be exposed by the encapsulant 20. In some arrangements, the alignment mark 14 may include a conductive material such as a metal or metal alloy. Examples of the conductive material include Au, Ag, Cu, Pt, Pd, other metal(s) or alloy(s), or a combination of two or more thereof. In some arrangements, the conductive terminals 12 and the alignment mark 14 may be formed by the same process, e.g., the same deposition and patterning operations. In some embodiments, the semiconductor device package 1 may include more than one alignment mark 14.

The encapsulant 20 may be disposed over or on the surface 105 of the carrier 10 to encapsulate the electronic component 11. In some arrangements, the encapsulant 20 is over the region 10A. In some arrangements, the encapsulant 20 is between the region 10A and the shielding layer 40. In some arrangements, the encapsulant 20 may include an epoxy resin having fillers, a molding compound (e.g., an epoxy molding compound or other molding compound), polyimide (PI), a phenolic compound or material, a material with a silicone dispersed therein, or a combination thereof.

The electronic component 30 may be disposed over the carrier 10. The electronic component 30 may be disposed over or on the surface 105 of the carrier 10 and spaced apart from the electronic component 11. The electronic component 30 may be disposed over or on the region 10B of the carrier 10. The electronic component 30 may be electrically connected to the carrier 10 (e.g., to the interconnection(s)) and the electronic component 11, and the electrical connection may be attained by way of flip-chip, wire-bond techniques, metal to metal bonding (such as Cu to Cu bonding), or hybrid bonding. For example, the electronic component 30 may be electrically connected to the conductive pads 10*p* of the carrier 10 through one or more electrical contacts 30*e* (also referred to as "conductive terminals"). In some arrangements, the electrical contacts 30*e* may include C4 bumps, a BGA, or an LGA. In some arrangements, a thickness of the electrical contact 30*e* may be from about 33 μm to about 55 μm, for example, about 40 μm.

In some arrangements, the electronic component 30 may be configured to provide external connection wiring. In some arrangements, the electronic component 30 may be configured to provide electrical connections between the semiconductor device package 1 and external components (e.g., external circuits or circuit boards). In some arrangements, the shielding layer 40 is exposed from a coverage of the electronic component 30 from a top view perspective. For example, the portions 410*a*, 420*a*, and 430*a* of the shielding layer 40 may be exposed from the electronic component 30. The electronic component 30 may be exposed by the shielding layer 40 from a top view perspective. For example, from a top view perspective, the electronic component 30 may be free from overlapping the shielding layer 40. In some arrangements, the electronic component 30 includes a connector. In some arrangements, the electronic component 30 may include a board-to-board connector or a connector for HotBar soldering.

The shielding layer 40 may be configured to provide EMI shielding to the electronic component 11. For example, the shielding layer 40 may be configured to provide EMI shielding protecting the electronic component 11 from interference.

In some arrangements, the shielding layer 40 may include Cu or other conductive materials, such as aluminum (Al), chromium (Cr), tin (Sn), nickel (Ni), Au, Ag, or stainless steel, another metal, or a mixture, an alloy, or other combinations of two or more thereof. In some arrangements, the shielding layer 40 may be or include a conductive layer or a conductive thin film. In some arrangements, the shielding layer 40 may be or include a multi-layered structure. For example, layers of the shielding layer 40 from the inside to the outside may include a seed layer (such as porous stainless steel, SUS), a conductive layer (such as Cu), and a protection layer (such as SUS).

The shielding layer 40 may be disposed over or on one or more outer surfaces of the semiconductor device package 1. In some arrangements, the shielding layer 40 may be in contact with one or more outer surfaces of the semiconductor device package 1. In some arrangements, the shielding layer 40 may directly contact one or more outer surfaces of the semiconductor device package 1. In some arrangements, the shielding layer 40 is over the encapsulant 20 and on at least two peripheral portions (e.g., peripheral portions 10B1, 10B2, and 10B3) of the region 10B of the carrier 10.

In some arrangements, the shielding layer 40 includes portions 410*a*, 410*b*, 420*a*, 420*b*, 430*a*, 430*b*, and 440. The portions 410*a*, 410*b*, 430*a*, and 430*b* are indicated in FIG. 1B.

In some arrangements, the portion 410*a* is over the region 10B (or the predetermined non-shielding region). In some arrangements, the portion 410*a* extends from the edge 10E1 toward the surface 108 of the carrier 10. In some arrangements, the portion 420*a* is over the region 10B (or the predetermined non-shielding region). In some arrangements, the portion 420*a* extends from the edge 10E2 toward the surface 108 of the carrier 10. In some arrangements, the portion 410*a* is over an edge (e.g., the peripheral portion 10B1) of the region 10B, and the portion 420*a* is over an edge (e.g., the peripheral portion 10B2) of the region 10B and adjacent to the portion 410*a*. In some arrangements, the portion 430*a* is over the region 10B (or the predetermined non-shielding region). In some arrangements, the portion 430*a* extends from the edge 10E3 toward the surface 108 of the carrier 10. In some arrangements, the portion 430*a* is over an edge (e.g., the peripheral portion 10B3) of the region 10B and opposite to the portion 410*a*. In some arrangements, the portion 410*a* is spaced apart from the portion 420*a*. In some arrangements, the portion 410*a* is spaced apart from the portion 430*a*. In some arrangements, the portion 420*a* is spaced apart from the portion 430*a*. In some arrangements, the portion 420*a* extends from the portion 410*a* toward the edge 10E3 and is electrically connected to the portion 410*a*. In some arrangements, the portion 420*a* extends to the side 102 (or the lateral side) of the carrier 10 and is electrically connected to the portion 410*a*. In some arrangements, a width W1 of the portion 410*a* is different from a width W2 of the portion 420*a* from a top view perspective. In some arrangements, a width W3 of the portion 430*a* is different from the width W1 of the portion 410*a* and/or the width W2 of the portion 420*a* from a top view perspective. The widths W1, W2, and W3 may be the same or different. The widths W1, W2, and W3 may be independently from about 11 μm to about 40 μm, from about 13 μm to about 37 μm, or from about 20 μm to about 30 μm.

In some arrangements, the portion 410*a* of the shielding layer 40 substantially aligns with the side 101 (or the lateral surface) of the carrier 10. In some arrangements, the portion 420*a* of the shielding layer 40 substantially aligns with the side 102 (or the lateral surface) of the carrier 10. In some arrangements, the portion 430*a* of the shielding layer 40 substantially aligns with the side 103 (or the lateral surface) of the carrier 10. In some arrangements, the peripheral portion 10B1 of the region 10B is at the edge over the side 101 of the carrier 10, the peripheral portion 10B2 of the region 10B is at the edge over the side 102 of the carrier 10, and the peripheral portion 10B3 of the region 10B is at the edge over the side 103 of the carrier 10. In some arrangements, the portion 410*a* of the shielding layer 40 is on the peripheral portion 10B1, the portion 420*a* of the shielding layer 40 is on the peripheral portion 10B2, and the portion 430*a* of the shielding layer 40 is on the peripheral portion 10B3. In some arrangements, the portion 410*a* is spaced apart from the portion 420*a*. In some arrangements, at least one of the portions 410*a*, 420*a*, and 430*a* may have a non-uniform thickness. For example, the thickness of the portion 420*a* may decrease from the side 102 toward the electronic component 30. According to some arrangements of the present disclosure, with the portions (e.g., the portions

410*a*, 420*a*, and 430*a*) of the shielding layer 40 further disposed on or over the region 10B (or the predetermined non-shielding region), the EMI shielding protection for the components/elements (e.g., the electronic component 11, the antenna elements 10*ap*, routing traces of the carrier 10, and etc.) of the semiconductor device package 1 may be further improved.

In some arrangements, the portion 440 of the shielding layer 40 is over or on the encapsulant 20. In some arrangements, the portion 440 is over the region 10A. In some arrangements, the portion 440 is over the region 10A and extends toward the region 10B. In some arrangements, the portion 440 is separated from the portions 410*a*, 420*a*, and 430*a* from a top view perspective. In some arrangements, the portion 440 is spaced apart from the portions 410*a*, 420*a*, and 430*a*. In some arrangements, the portion 440 is distinct from the portions 410*a*, 420*a*, and 430*a*. In some arrangements, the portion 440 may be electrically connected to the grounding line 10*g* through the conductive pad 10*p* and the conductive via 10*v*. The electronic component 30 may be surrounded by the shielding layer 40. In some arrangements, the electronic component 30 is surrounded by the portions 410*a*, 420*a*, 430*a*, and 440.

In some arrangements, a distance D1B between the electronic component 30 and the portion 410*a* of the shielding layer 40 is less than a distance D1 between the electronic component 30 and the portion 440 of the shielding layer 40. In some arrangements, a distance D2B between the electronic component 30 and the portion 420*a* of the shielding layer 40 is less than the distance D1 between the electronic component 30 and the portion 440 of the shielding layer 40. In some arrangements, a distance D3B between the electronic component 30 and the portion 430*a* of the shielding layer 40 is less than the distance D1 between the electronic component 30 and the portion 440 of the shielding layer 40. In some embodiments, the distance D1B between the electronic component 30 and the portion 410*a* is greater than a width W1 of the portion 410*a*. In some embodiments, the distance D2B between the electronic component 30 and the portion 420*a* is greater than a width W2 of the portion 420*a*. In some embodiments, the distance D3B between the electronic component 30 and the portion 430*a* is greater than a width W3 of the portion 430*a*.

In some arrangements, the portion 420*b* of the shielding layer 40 covers the side 102 of the carrier 10. In some arrangements, the portion 420*b* is connected to the portion 420*a*. In some arrangements, the portion 420*b* protrudes upwards and beyond the surface 105 of the carrier 10. In some arrangements, the portion 420*b* tapers toward the surface 106 of the carrier 10. In some arrangements, a width W2*b* of the portion 420*b* decreases toward the surface 106 of the carrier 10. In some arrangements, a width W1*b* of the portion 410*b* is different from the width W2*b* of the portion 420*b*. In some arrangements, a width W3*b* of the portion 430*b* is different from the width W1*b* of the portion 410*b* and/or the width W2*b* of the portion 420*b*. The distances D1B and D3B and the widths W1, W1*b*, W3, and W3*b* are indicated in FIG. 1B.

Figure 1C:
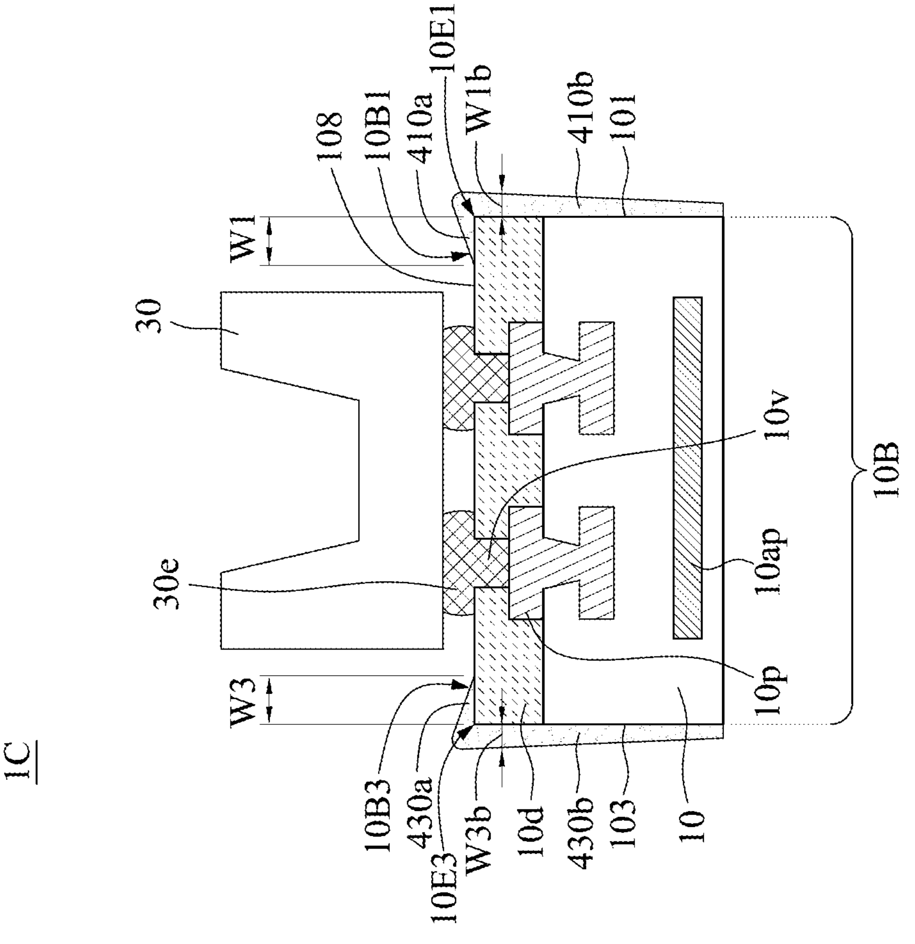
FIG. 1C is a cross-section of a semiconductor device package, in accordance with some arrangements of the present disclosure.

FIG. 1C is a cross-section of a semiconductor device package 1C, in accordance with some arrangements of the present disclosure. In some arrangements, FIG. 1C may be a cross-section through the line C-C' in the top view in FIG. 1B.

In some arrangements, the portion 410*b* of the shielding layer 40 covers the side 101 of the carrier 10. In some arrangements, the portion 410*b* extends toward the side 101 of the carrier 10. In some arrangements, the portion 410*b* extends on or over the side 101 (or the lateral side) of the carrier 10. In some arrangements, the portion 410*b* is connected to the portion 410*a*. In some arrangements, the portion 410*b* protrudes upwards and beyond the surface 105 of the carrier 10. In some arrangements, the portion 410*b* tapers toward the surface 106 of the carrier 10. In some arrangements, the portion 410*b* tapers toward an edge of the surface 106 of the carrier 10. In some arrangements, the width W1*b* of the portion 410*b* decreases toward the surface 106 of the carrier 10. In some arrangements, the portion 430*b* of the shielding layer 40 covers the side 103 of the carrier 10. In some arrangements, the portion 430*b* is connected to the portion 430*a*. In some arrangements, the portion 430*b* protrudes upwards and beyond the surface 105 of the carrier 10. In some arrangements, the portion 430*b* tapers toward the surface 106 of the carrier 10. In some arrangements, the width W3*b* of the portion 430*b* decreases toward the surface 106 of the carrier 10.

In some arrangements, the portion 410*a* of the shielding layer 40 has a non-uniform thickness. For example, the thickness of the portion 410*a* may decrease from the side 101 toward the electronic component 30. In some arrangements, the portion 430*a* of the shielding layer 40 has a non-uniform thickness. For example, the thickness of the portion 430*a* may decrease from the side 103 toward the electronic component 30.

Figure 1D:
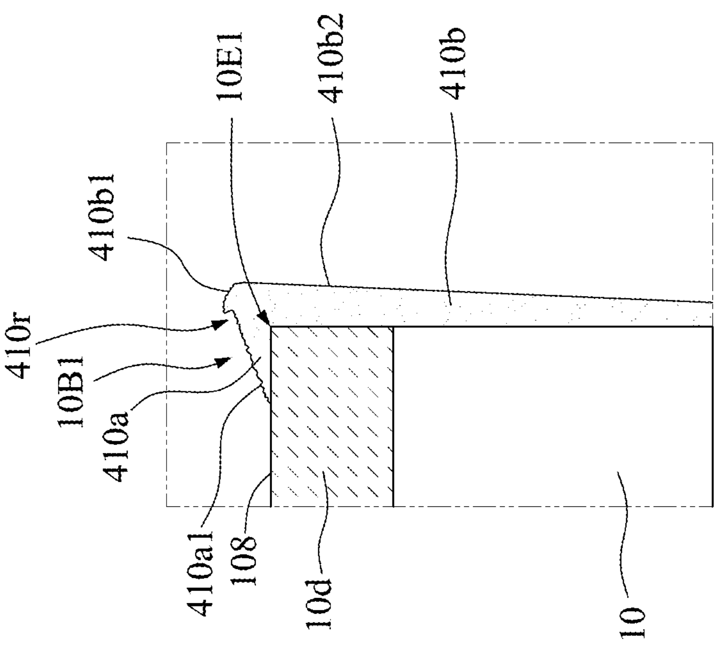
FIG. 1D is an enlarged view of a part of a semiconductor device package, in accordance with some arrangements of the present disclosure.

FIG. 1D is an enlarged view of a part of a semiconductor device package, in accordance with some arrangements of the present disclosure. The enlarged view of FIG. 1D may be a part of the semiconductor device package 1 in FIG. 1A.

In some arrangements, the portion 410*a* of the shielding layer 40 may have a rough upper surface 410*al*. In some embodiments, the portion 410*b* of the shielding layer 40 has an upper surface 410*b*1 and a lateral surface 410*b*2 (also referred to as "a sidewall") having a roughness less than a roughness of the upper surface 410*b*1. The roughness of the lateral surface 410*b*2 of the portion 410*b* may be less than a roughness of the upper surface 410*al* of the portion 410*a*. In some arrangements, the portion 410*a* and the portion 410*b* may define a recess 410*r*. A surface (e.g., portions of the upper surface 410*al* and the upper surface 410*b*1) of the recess 410*r* may have a roughness greater than or exceeding the roughness of the lateral surface 410*b*2. In some arrangements, a thickness of the portion 410*a* of the shielding layer 40 gradually increases from the surface 108 toward the edge 10E1 of the carrier 10 from a cross-sectional view perspective.

Figure 1E:
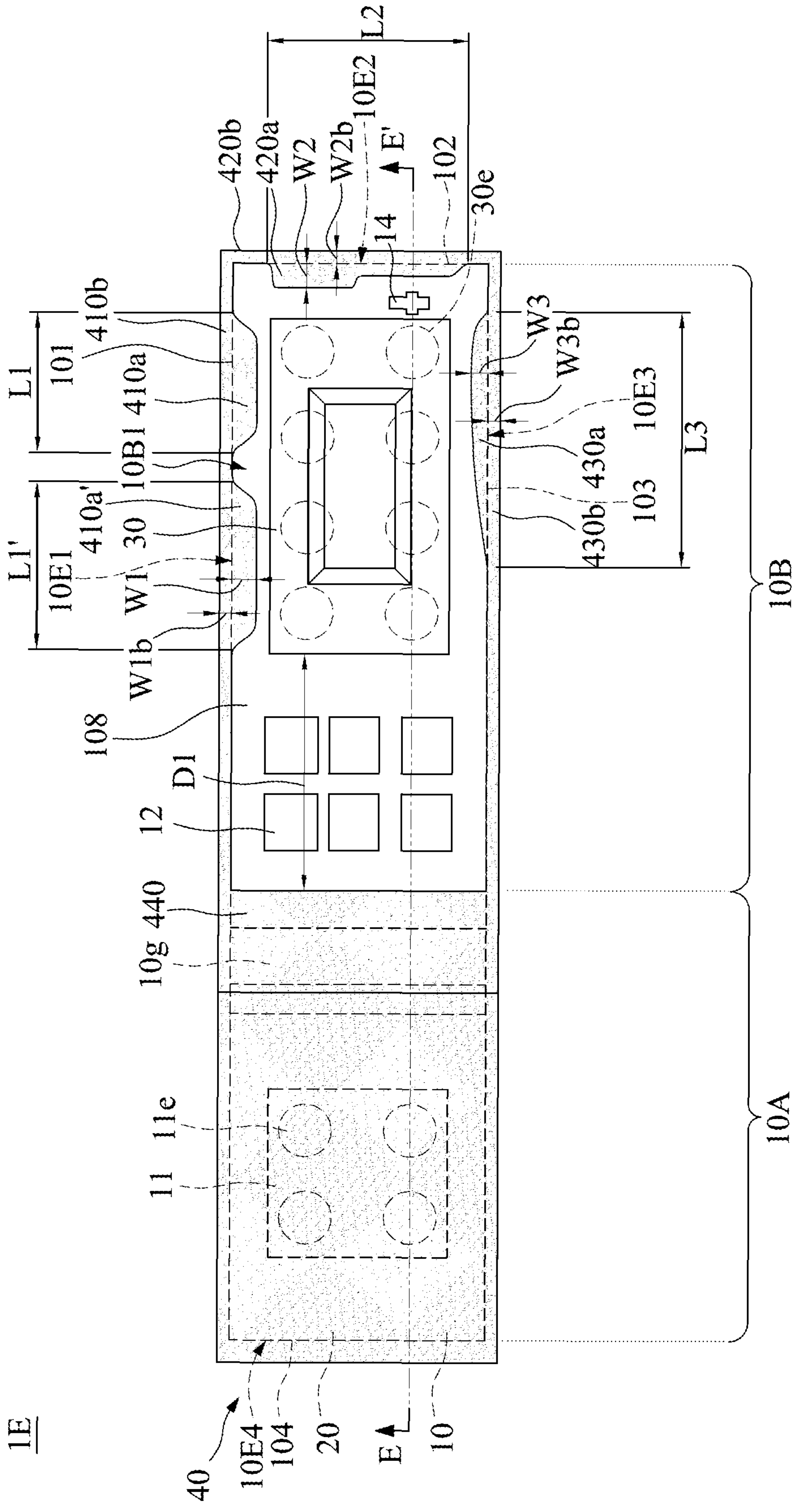
FIG. 1E is a top view of a semiconductor device package, in accordance with some arrangements of the present disclosure.

FIG. 1E is a top view of a semiconductor device package 1E, in accordance with some arrangements of the present disclosure. In some arrangements, the cross-section in FIG. 1A is a cross-section through the line E-E' in the top view in FIG. 1E.

In some arrangements, the shielding layer 40 includes a plurality of portions (e.g., portions 410*a* and 410*a*') over the region 10B and spaced apart from each other. In some arrangements, the portions 410*a* and 410*a*' extend from the edge 10E1 toward the surface 108 of the carrier 10. In some arrangements, the portion 410*a* is distinct from the portion 410*a*'. In some arrangements, the portion 410*a* is separated from the portion 410*a*'. In some arrangements, the portion 420*a* of the shielding layer 40 has a non-uniform width W2 from a top view perspective. In some arrangements, the portion 430*a* of the shielding layer 40 has a non-uniform width W3 from a top view perspective.

In some arrangements, a length L1 of the portion 410*a* is different from a length L1' of the portion 410*a*' from a top view perspective. In some arrangements, a length L2 of the portion 420*a* is different from the length L1 of the portion 410*a* and/or the length L1' of the portion 410*a*' from a top view perspective. In some arrangements, a length L3 of the portion 430*a* is different from the length L1 of the portion 410*a* and/or the length L1' of the portion 410*a*' and/or the length L2 of the portion 420*a* from a top view perspective. The lengths L1, L1', L2, and L3 may be the same or different.

FIG. 2A1, FIG. 2C1, FIG. 2D1, FIG. 2E1, FIG. 2F1, FIG. 2G1, and FIG. 2H1 are top views during one or more stages of a method of manufacturing a semiconductor device package in accordance with some arrangements of the present disclosure. FIG. 2A2, FIG. 2B, FIG. 2C2, FIG. 2D2, FIG. 2E2, FIG. 2F2, FIG. 2G2, and FIG. 2H2 are cross-sections during one or more stages of a method of manufacturing a semiconductor device package in accordance with some arrangements of the present disclosure. In some arrangements, FIG. 2A2, FIG. 2C2, FIG. 2D2, FIG. 2E2, FIG. 2F2, FIG. 2G2, and FIG. 2H2 are cross-sections of the top views in FIG. 2A1, FIG. 2C1, FIG. 2D1, FIG. 2E1, FIG. 2F1, FIG. 2G1, and FIG. 2H1, respectively.

At least some of these figures have been simplified to better understand the aspects of the present disclosure. In some arrangements, the semiconductor device package 1 may be manufactured through the operations described with respect to FIG. 2A1 through FIG. 2G1 and FIG. 2A2 through FIG. 2G2.

Referring to FIG. 2A1 and FIG. 2A2, a strip 1000 (also referred to as "a carrier strip") including a plurality of carriers 10 (also referred to as "substrate units") may be provided. The strip 1000 may include regions 1000A and 1000B. Each of the carriers 1000 (or the substrate units) may include a predetermined non-shielding region, and the predetermined non-shielding regions collectively form the region 1000B. In some arrangements, electrical contacts 30*e* (or conductive terminals) are disposed or formed on the regions 1000B of the strip 1000. In some arrangements, each of the carriers 10 includes the electrical contacts 30*e* (or the conductive terminals). Electronic components 11 may be electrically connected to the regions 1000A of the strip 1000. In some arrangements, the electronic components 11 are electrically connected to the carriers 10 of the strip 1000 through electrical contacts 11*e* (or conductive terminals). An encapsulating material 200 may be formed on the regions 1000A of the strip 1000. In some arrangements, the regions 1000B (also referred to as "non-molding areas") are exposed by the encapsulating material 200. In some arrangements, the encapsulating material 200 is formed on the carriers 10. In some arrangements, the electronic components 11 are covered by the encapsulating material 200, and the electrical contacts 30*e* (or the conductive terminals) are exposed by the encapsulating material 200.

Referring to FIGS. 2B, 2C1 and 2C2, a mask layer 600 may be formed or disposed to cover the predetermined non-shielding region of at least one of the carriers 10 (or the substrate units) of the strip 1000 (or the carrier strip). In some arrangement, the mask layer 600 covers the predetermined non-shielding regions of at least two of the carriers 10 (or the substrate units) of the strip 1000 (or the carrier strip). In some arrangement, the mask layer 600 may be disposed on each of the regions 1000B (or the non-molding areas) of the strip 1000. In some arrangements, the mask layer 600 is formed over the electrical contacts 30*e* (or the conductive terminals) of the carriers 10 of the strip 1000. The mask layer 600 may be or include an adhesive mask layer, e.g., a tape. In some arrangements, the mask layer 600 is or includes a thermally stable tape. In some arrangements, the mask layer 600 may be or include a jig. In some arrangements, each of the mask layer 600 may be disposed on each of the regions 1000B (or the non-molding areas) of the strip 1000.

Figure 2B:
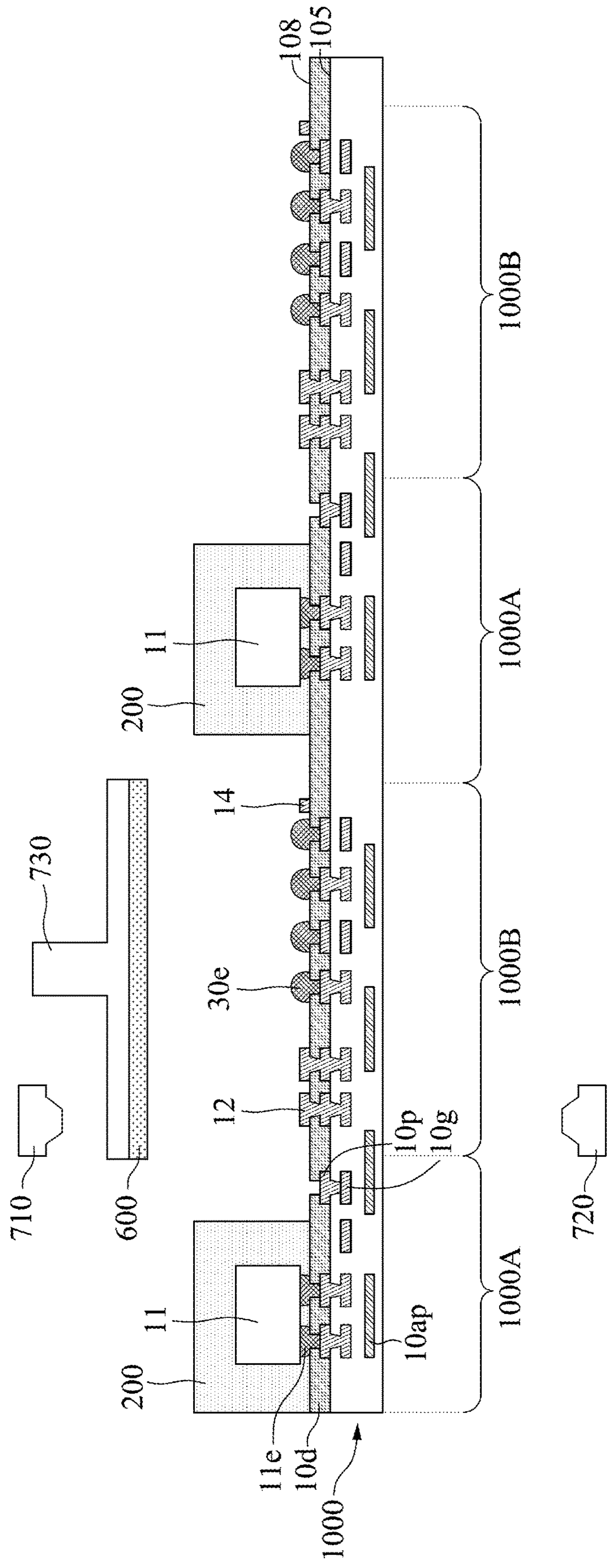

As shown in FIG. 2B, in some arrangements, the mask layer 600 is aligned with one or more alignment marks 14 on the strip 1000 prior to forming the mask layer 600 over the electrical contacts 30*e* (or the conductive terminals) of the carriers 10. Aligning the mask layer 600 may include the following operations. In some arrangements, a pick-up tool 730 for disposing the mask layer 600 is provided. The mask layer 600 may be adhered to the pick-up tool 730 prior to alignment operations. In some arrangements, an alignment tool 710 over the strip 1000 is used to obtain a positional information of the alignment mark 14 on the strip 1000, and an alignment tool 720 below the pick-up tool 730 which the mask layer 600 is adhered to is used to obtain a positional information of the mask layer 600. In some arrangements, the mask layer 600 is aligned with the alignment mark 14 according to the positional information of the alignment mark 14 and the mask layer 600. The mask layer 600 may be aligned with the alignment mark 14 by moving the pick-up tool 730. In some arrangements, the pick-up tool 730 is moved to align the mask layer 600 with the alignment mark 14 on the carriers 10. The mask layer 600 may be aligned with the alignment mark 14 to determine the region (or borders of the region), e.g., the region 1000B, on which the mask layer 600 is disposed or laminated. The alignment tools 710 and 720 may include CCD image sensors.

Next, as shown in FIGS. 2C1 and 2C2, the mask layer 600 may be disposed on each of the regions 1000B (or the non-molding areas) over the electrical contacts 30*e* (or the conductive terminals) of the carriers 10 of the strip 1000 after the alignment is completed. The mask layer 600 may be disposed or formed to cover the electrical contacts 30*e* (or the conductive terminals) of the carriers 10 of the strip 1000 after the alignment is completed. In some arrangements, the conductive terminals 12 are covered by the mask layer 600. In some arrangements, the alignment mark 14 is covered by the mask layer 600. In some arrangements, the mask layer 600 is disposed by using (or moving) the pick-up tool 730.

Referring to FIG. 2D1 and FIG. 2D2, after the mask layer 600 is entirely disposed on each of the regions 1000B (or the non-molding areas) of the strip 1000, the mask layer 600 may be rolled (or pressed). In some arrangements, a roller 740 (or a roll laminator) is pressed on the mask layer 600 to laminate the entire mask layer 600 onto the region 1000B of the carrier 10. The roller 740 may be pressed onto the mask layer 600 and rolled along a direction DR1 which is substantially parallel to a length direction of the mask layer 600. In some arrangements, an external force is applied from the roller 740 to laminate the mask layer 600 onto the surface of the strip 1000. The electrical contacts 30*e* and the conductive terminals 12 may be pressed into portions of the mask layer 600 and entirely covered by the mask layer 600. In some arrangements, the roller 740 is aligned with the mask layer 600 prior to rolling or pressing the mask layer 600.

In some arrangements, the mask layer 600 has an adhesive strength from about 450 gf/inch to about 700 gf/inch, for example, from 500 gf/inch to about 650 gf/inch. The mask layer 600 may include a base layer and an adhesive layer on the base layer. In some arrangements, the base layer of the mask layer 600 has a thickness from about 40 μm to about 60 μm, for example, about 50 μm. In some arrangements, the adhesive layer of the mask layer 600 has a thickness from about 60 μm to about 90 μm, for example, about 75 μm.

In some cases where a shielding layer is formed on one or more outer surfaces of a semiconductor device package, a mask (e.g., a jig) may be utilized to protect the conductive pads 10*p* and the electrical contacts 30*e*. However, while a jig usually occupies a relatively large volume due to its relatively large thickness, the dimensions of the jig cannot be compatible with the desired relatively small keep out zone (KOZ) around conductive terminals (e.g., between the conductive terminals 12 and the grounding line 10*g*). Accordingly, the distance between the conductive terminals 12 and the grounding line 10*g* may be relatively large, which is disadvantageous to miniaturization of the package.

In contrast, according to some arrangements of the present disclosure, the mask layer 600 is used to cover the electrical contacts 30*e* and the conductive terminals 12, and thus the distance between the conductive terminals 12 and the grounding line 10*g* may be relatively small, which is advantageous to miniaturization of the package.

In addition, in some cases where a tape may be disposed and laminated simultaneously, a portion of the tape is rolled laminated onto a target layer while another portion of the tape remains floated or unattached to the target layer. As such, the tape may shift easily during the rolled lamination process, increasing the required shift tolerance in space or area and commensurately the KOZ, such that the package exceeds acceptable sizes. To address such shortcomings, according to some arrangements of the present disclosure, the mask layer 600 is laminated to the strip 1000 by the roller 740 after the mask layer 600 is entirely disposed on the desired location of the strip 1000 and covering the electrical contacts 30*e* and the conductive terminals 12, such that the rolled lamination process is performed after the position of the mask layer 600 is fixed, and required shift tolerance in space or area can be decreased or contained (e.g., the shift may be reduced or limited to 20 μm or less, for example, about 15 μm or less), thereby decreasing the KOZ, and, accordingly, package size.

Moreover, according to some arrangements of the present disclosure, the alignment tools 710 and 720 are used for aligning the mask layer 600 to the alignment mark 14 so as to accurately determine the region (e.g., the region 1000B) on which the mask layer 600 is disposed, therefore the accuracy of the following operation for forming the shielding material 400 or the shielding layer 40 is improved. With the improved accuracy of the predetermined location of the formation of the shielding layer 40, the required shift tolerance in space or area can be further decreased or contained, e.g., the KOZ can be reduced to about 50 μm or less, and package size can be further reduced. In addition, according to some arrangements of the present disclosure, with the alignment tool 720 arranged below the pick-up tool 730, the alignment tool 720 can not only obtain a positional information of the mask layer 600, but also perform an evaluation operation to pick out the unqualified mask layer 600 before it is disposed on the strip 1000, thereby improving yield.

Furthermore, for example, if the mask layer 600 is too thin (e.g., below the aforesaid range), it may fall off or separate from the electrical contacts 30*e* and the conductive terminals 12 or shift from the predetermined region, resulting insufficient cover of the electrical contacts 30*e* and the conductive terminals 12. On the other hand, if the mask layer 600 is too thick (e.g., exceeding the aforesaid range), a relatively large adhesion area is formed between the mask layer 600 and the electrical contacts 30*e* and the conductive terminals 12, bubbles may be trapped between the mask layer 600 and the strip 1000 which are difficult to expel, e.g., by rolled lamination. As such, heat generated in subsequent operations (e.g., sputtering operation for forming a shielding material 400) may not be effectively dissipated, and thus burn marks may be generated within or on the shielding layer 40. To address the shortcoming, according to some arrangements of the present disclosure, with the aforesaid combination of the ranges of the thickness and the adhesive strength, the mask layer 600 can be accurately laminated on the predetermined region (e.g., the region 1000B) on the strip 1000 without peeling or shift. Therefore, yield can be improved.

Referring to FIG. 2E1 and FIG. 2E2, a singulation operation may be performed on the strip 1000 and the mask layer 600 to form a plurality of singulated structures 1A each including one of the carriers 10 and a mask 60 (also referred to as "a mask unit") formed from a portion of the mask layer 600. In some arrangements, the strip 1000 is divided to separate the carriers 10 (or the substrate units) from each other. In some embodiments, the mask layer 600 is divided to from separated masks 60 (or the mask units). In some arrangements, the singulation operation is further performed on the encapsulating material 200 to form a plurality of encapsulants 20 each disposed on each of the carriers 10. In some arrangements, each of the carriers 10 includes a region 10A covered by the encapsulant 20 and a region 10B (or a non-molding area) including the electrical contacts 30*e* exposed by the encapsulant 20 and covered by the mask 60. Each of the singulated structures 1A may include a portion (e.g., the region 10A) covered by the encapsulant 20 and a portion (e.g., the region 10B) exposed by the encapsulant 20. In some arrangements, the mask 60 covers the region 10B of the carrier 10. In some arrangements, the conductive pad 10*p* over the grounding line 10*g* is exposed by the encapsulant 20 and the mask 60. In other arrangements, the mask 60 may further cover the conductive pad 10*p* over the grounding line 10*g* (not shown in FIG. 2E).

In some arrangements, the singulation operation is performed by using a cutting tool. In some arrangements, the cutting tool cuts through scribing lines to separate the mask layer 600 into separate masks 60. In some arrangements, one or more edge portions of the mask 60 may float over the surface 105 of the carrier 10. In some arrangements, a gap G1 (or a void) may be formed between the floated edge portion of the mask 60 and the surface 105 of the carrier 10. In some arrangements, a portion of the mask 60 exposed to the gap G1 may have an uneven, irregular, or rough surface 611. In some arrangements, the gap G1 is spaced apart from the alignment mark 14. In some embodiments, a portion of the surface 105 of the carrier 10 is exposed by the mask 60 and exposed to the gap G1. In some embodiments, the gap G1 may expose two or three peripheral regions of the surface 105 of the carrier 10.

Referring to FIG. 2F1 and FIG. 2F2, the singulated structures 1A may be disposed on a temporary carrier 800. In some arrangements, the singulated structures 1A are disposed on the temporary carrier 800 prior to forming a shielding layer.

Referring to FIG. 2G1 and FIG. 2G2, a shielding material 400 (also referred to as "a shielding layer") may be formed over or on the singulated structures 1A on the temporary carrier 800. In some arrangements, after the singulation operation is performed to form the singulated structures 1A, the shielding material 400 is formed on the encapsulant 20 and the mask 60 of each of the carriers 10. The shielding material 400 may be formed by, for example, a physical vapor deposition (PVD), such as a sputtering operation or a spray coating operation, or a chemical vapor deposition (CVD) or plating. In some arrangements, the shielding material 400 (or the shielding layer) is formed at least partially over the region 10B (or the predetermined non-shielding region). In some arrangements, the shielding material 400 (or the shielding layer) is formed at least partially between the region 10B (or the predetermined non-shielding region) and the mask 60. In some arrangements, the shielding material 400 is formed on at least two sides of the region 10B (or the non-molding area) of each of the carriers 10. In some arrangements, a portion of the shielding material 400 extends between the mask 60 and the surface 105 of the carrier 10, and the portion of the shielding material 400 is spaced apart from the electrical contacts 30*e* (or the conductive terminals). In some arrangements, a portion of the shielding material 400 extends into the gap G1 of the singulated structure 1A. In some embodiments, a portion of the shielding material 400 extends into the gap G1 and covers at least a portion (e.g., the surface 611) of the floated portion of the mask 60.

In some cases where jigs are used for forming the shielding layer, each of the jigs has to be disposed on each of the singulated structures 1A, followed by forming the shielding layer over the singulated structures 1A. As such, placing jigs on the singulated structures 1A requires a lot of processing time and increases the processing complexity. In contrast, according to some arrangements of the present disclosure, with the mask layer 600 disposed over the region 1000B of the strip 1000, the masks 60 for each of the singulated structures 1A can be formed in a single operation and together with the existing singulation operation. Therefore, the processing time is reduced significantly, and the process is simplified.

Referring to FIG. 2H1 and FIG. 2H2, the mask 60 may be removed to expose the electrical contacts 30*e*, and an electronic component 30 may be disposed over the carrier 10 and on the electrical contacts 30*e*. The masks 60 of the singulated structures 1A on the temporary carrier 800 may be removed by the same operation. In some arrangements, an adhesive layer (or an adhesive sheet) may be disposed on and adhered to the masks 60, and then the adhesive layer may be lifted up to remove the masks 60 simultaneously. The adhesive layer may have an adhesive strength greater than the adhesive strength of the masks 60 (i.e., the adhesive strength of the mask layer 600).

Next, the electronic component 30 may be electrically connected to the conductive pad 10*p* of the carrier 10 through the electrical contacts 30*e*. In some arrangements, a surface treatment may be performed to the surface 105 to reflow or melt the electrical contacts 30*e*. The surface treatment may include, for example, a plasma treatment, a heat treatment, a laser treatment, a combination thereof, or another suitable treatment. In some arrangements, a portion of the shielding material 400 on the mask 60 is removed together with the removal of the mask 60 to form a shielding layer 40. In some embodiments, the shielding layer 40 is formed over the region 10B (or the predetermined non-shielding region). In some arrangements, the mask 60 is removed from the singulated structure 1A to form the shielding layer 40 on at least two sides of the region 10B (or the non-molding area) of the carrier 10. In some arrangements, after the mask 60 is removed, at least a portion of the shielding layer 40 over the region 10B (or the predetermined non-shielding region) is exposed. In some embodiments, a portion of the shielding material 400 within the gap G1 and at least partially covering the floated portion (e.g., the rough surface 611) of the mask 60 forms the shielding layer 40 having a structure as illustrated in FIG. 1D, and the recess 410*r* may be conformal with a portion of the morphology of the floated portion of the mask 60. In some arrangements, the electronic component 30 is adjacent to the shielding layer 40 on the least two sides of the region 10B (or the non-molding area) of the carrier 10. In some arrangements, the temporary carrier 800 is removed to form the semiconductor device package 1 illustrated in FIG. 2H1 and FIG. 2H2.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of said numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, two numerical values can be deemed to be "substantially" or "about" the same if a difference between the values is less than or equal to +10% of an average of the values, such as less than or equal to +5%, less than or equal to +4%, less than or equal to +3%, less than or equal to ±2%, less than or equal to +1%, less than or equal to +0.5%, less than or equal to +0.1%, or less than or equal to ±0.05%. For example, "substantially" parallel can refer to a range of angular variation relative to 0° that is less than or equal to +10°, such as less than or equal to +5°, less than or equal to ±4°, less than or equal to +3°, less than or equal to +2°, less than or equal to +1, less than or equal to +0.5°, less than or equal to +0.1°, or less than or equal to +0.05°. For example, "substantially" perpendicular can refer to a range of angular variation relative to 90° that is less than or equal to ±10°, such as less than or equal to +5°, less than or equal to +4°, less than or equal to +3°, less than or equal to +2°, less than or equal to +1, less than or equal to +0.5°, less than or equal to +0.10, or less than or equal to +0.05°.

Two surfaces can be deemed to be coplanar or substantially coplanar if a displacement between the two surfaces is no greater than 5 μm, no greater than 2 μm, no greater than 1 μm, or no greater than 0.5p m.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not intended to limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
- a carrier comprising a predetermined non-shielding region;
- an electronic component disposed over the predetermined non-shielding region; and
- a shielding layer comprising a first portion and a second portion disposed over the predetermined non-shielding region, the first portion extending from a first edge of the carrier toward a top surface of the carrier, the second portion extending from a second edge toward the top surface of the carrier, and the second edge is distinct from the first edge,
- wherein the third portion of the shielding layer has a non-uniform width from a top view perspective.

2. The semiconductor device package of claim 1, wherein the shielding layer further comprises a third portion disposed over the predetermined non-shielding region, the third portion extends from the first edge toward the top surface of the carrier, and the second third portion is separated from the first portion.

3. The semiconductor device package of claim 1, wherein the first portion of the shielding layer is spaced apart from the second portion of the shielding layer.

4. The semiconductor device package of claim 1, wherein a length of the first portion of the shielding layer is different from a length of the second portion of the shielding layer from a top view perspective.

5. The semiconductor device package of claim 1, wherein the carrier further comprises a shielding region, the shielding layer further comprises a fourth portion disposed over the shielding region, and the fourth portion is separated from the first portion from a top view perspective.

6. The semiconductor device package of claim 5, further comprising an encapsulant disposed between the shielding region and the shielding layer.

7. The semiconductor device package of claim 5, wherein a distance between the electronic component and the first portion of the shielding layer is less than a distance between the electronic component and the fourth portion of the shielding layer.

8. The semiconductor device package of claim 7, wherein the distance between the electronic component and the first portion of the shielding layer is greater than a width of the first portion.

9. The semiconductor device package of claim 1, wherein the second portion of the shielding layer extends to a second lateral side of the carrier and is electrically connected to the first portion.

10. The semiconductor device package of claim 1, wherein the first portion of the shielding layer is exposed from a coverage of the electronic component.

11. The semiconductor device package of claim 1, wherein the electronic component comprises a connector configured to provide an external connection wiring.

12. The semiconductor device package of claim 1, further comprising an alignment mark disposed over the predetermined non-shielding region.

13. A semiconductor device package, comprising:
- a carrier comprising a predetermined non-shielding region;
- an electronic component disposed over the predetermined non-shielding region; and
- a shielding layer comprising a first portion disposed over the predetermined non-shielding region and a second portion connected to the first portion and extending over a first lateral side of the carrier,
- wherein a roughness of an upper surface of the first portion is greater than a roughness of a lateral surface of the second portion.

14. The semiconductor device package of claim 13, wherein the second portion of the shielding layer tapers toward an edge of a bottom surface of the carrier.

15. The semiconductor device package of claim 13, wherein the carrier includes am antenna element laterally covered by the second portion of the shielding layer and vertically overlapping the electronic component in a cross-sectional view.

16. A semiconductor device package, comprising
- a carrier comprising a predetermined non-shielding region;
- an electronic component disposed over the predetermined non-shielding region; and
- a shielding layer comprising a first portion disposed over the predetermined non-shielding region,
- wherein a thickness of the first portion of the shielding layer gradually increases from a top surface of the carrier toward an edge of the carrier from a cross-sectional view perspective.

* * * * *